United States Patent
Yamahira et al.

(10) Patent No.: US 6,940,332 B2
(45) Date of Patent: Sep. 6, 2005

(54) LEVEL SHIFT CIRCUIT HAVING CONTROL CIRCUITS FOR HIGH SPEED, AREA SAVING AND POWER SAVING

(75) Inventors: Seiji Yamahira, Osaka (JP); Norio Hattori, Kyoto (JP); Ken Arakawa, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 12 days.

(21) Appl. No.: 10/681,370

(22) Filed: Oct. 9, 2003

(65) Prior Publication Data

US 2004/0124901 A1 Jul. 1, 2004

(30) Foreign Application Priority Data

Oct. 30, 2002 (JP) .......................................... 2002-315719

(51) Int. Cl.[7] ................................................. H03L 5/00
(52) U.S. Cl. ............................ 327/333; 326/63; 326/80
(58) Field of Search ......................... 327/333, 374–377; 326/62–63, 68, 80, 81

(56) References Cited

U.S. PATENT DOCUMENTS 4,450,371 A * 5/1984 Bismarck ...................... 326/17
6,307,398 B2   10/2001 Merritt et al. ................. 326/81
6,373,315 B2 *  4/2002 Tsuji et al. .................... 327/333
6,828,825 B2 * 12/2004 Johnson et al. ............... 326/68

FOREIGN PATENT DOCUMENTS

JP            2-188024        7/1990

* cited by examiner

Primary Examiner—Minh Nguyen
(74) Attorney, Agent, or Firm—McDermott Will & Emery LLP

(57) ABSTRACT

A level shift circuit realizes a high-speed and power-saved operation particularly when the input voltage is at a low level. The level shift circuit includes a first gate voltage control circuit controlled by an inverted signal of an input signal, which is inserted between a gate of a third transistor and a second output terminal; a second gate voltage control circuit controlled by the input signal, which is inserted between a gate of a fourth transistor and a first output terminal; a first transistor; and a second transistor. When the input signal shifts from "H" to "L", the first transistor turns OFF, the third transistor is turned ON by the first gate voltage control circuit, and then a voltage of the first output terminal rises. The second transistor turns ON, the fourth transistor is turned OFF by the second gate voltage control circuit, and the voltage of the second output terminal goes down.

9 Claims, 22 Drawing Sheets

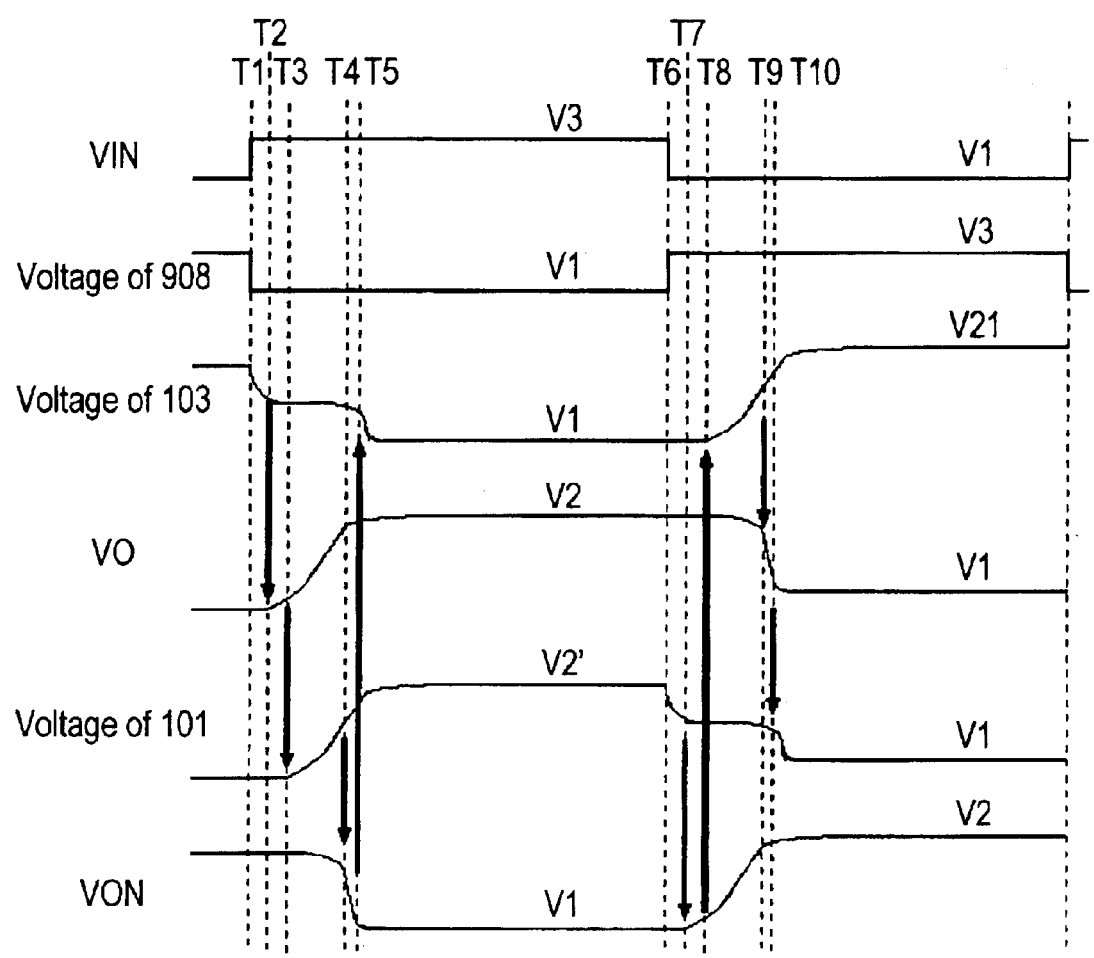

LEVEL SHIFT CIRCUIT HAVING CONTROL CIRCUITS FOR HIGH SPEED, AREA SAVING AND POWER SAVING

FIELD OF THE INVENTION

The present invention relates to a level shift circuit, and more particularly, to a level shift circuit suited for high-speed, power-saved driving operation when a low voltage level of input signal is shifted to a high voltage level.

BACKGROUND OF THE INVENTION

FIG. 14A shows a conventional level shift circuit. In FIG. 14A, terminal VO outputs a signal that is same in phase as input signal VIN, and terminal VON outputs a signal that is reverse in phase to input signal VIN.

The voltage level of first power source 1000 (hereafter referred to as power source 1000) is V1, the voltage level of second power source 1001 (hereafter referred to as power source 1001) is V2, and the voltage level of third power source 1002 (hereafter referred to as power source 1002) is V3. The voltage level V3 is an amplitude voltage of input signal VIN, and the voltage level V3 is same in voltage level as voltage V2 or a different voltage level. Inverter circuit 1003 executes the logical inversion of the input signal VIN. The voltage level V1 is supplied to the source of the first conduction type transistor 1004 (hereafter referred to as transistor 1004), the input signal VIN is applied to the gate, and the drain is connected to the output terminal VON. The voltage level V1 is supplied to the source of the first conduction type transistor 1005 (hereafter referred to as transistor 1005), a logically inverted signal of input signal VIN is applied to the gate, and the drain is connected to the output terminal VO. The voltage level V2 is supplied to the source of the second conduction type transistor 1006 (hereafter referred to as transistor 1006), the gate is connected to the output terminal VO, and the drain is connected to the output terminal VON. The voltage level V2 is supplied to the source of the second conduction type transistor 1007 (hereafter referred to as transistor 1007), the gate is connected to the output terminal VON, and the drain is connected to the output terminal VO. Signal 1008 is reverse in phase to the input signal VIN.

Regarding a level shift circuit having a configuration as described above, the operation of FIG. 14A will be described by using FIG. 14B. In the following description, when the voltage is at a low level, it is represented by "L", and when the voltage is at a high level, it is represented by "H".

When the voltage of input signal VIN is "L", the voltage of signal 1008 is "H". Accordingly, the voltage of output terminal VO is V1, and the transistor 1006 is ON. Also, the output terminal VON is same in potential as V2, and the transistor 1007 is OFF.

In the above condition, when the voltage of input signal VIN shifts from "L" to "H" at time T1, then the voltage of signal 1008 shifts from "H" to "L". At the same time, the transistor 1004 turns ON, and the transistor 1005 turns OFF. Accordingly, the transistor 1006 and transistor 1004 turn ON, while the transistor 1007 and transistor 1005 turn OFF.

At that time, since the drain current Idsn of transistor 1004 is saturated, it can be represented by formula (1).

$$Idsn = Kn(Vgsn - Vtn)^2 \qquad (1)$$

As the drain current Idsp of transistor 1006 is not saturated, it can be represented by formula (2).

$$Idsp1 = 2Kp(Vgsp - Vtp - Vdsp/2)Vdsp \qquad (2)$$

After that, when the voltage of output terminal VON lowers from V2 to become |V2−VON|>|Vgsp−Vtp|, then the drain current Idsp of transistor 1006 changes to a saturated state, establishing the formula (3).

$$Idsp2 = Kn(Vgsn - Vtp)^2 \qquad (3)$$

In the formulas (1), (2), and (3), constant Kn is the conduction coefficient of transistors 1004 and 1005, constant Kp is the conduction coefficient of transistors 1006 and 1007, constant Vgsn is the gate-source voltage of transistors 1004 and 1005, constant Vgsp is the gate-source voltage of transistors 1006 and 1007, constant Vtn is the threshold value of transistors 1004 and 1005, constant Vtp is the threshold value of transistors 1006 and 1007, and constant Vdsp is the drain-source voltage of transistors 1006 and 1007.

In case the voltage V3 is higher than V2 when the input signal VIN is "H", then from formulas (1) and (2), |Idsn|>>|Idsp1| will be satisfied. And, the voltage of output terminal VON lowers from the level of V2. When VON<(V2−|Vtp|) is satisfied at time T2, the transistor 1007 turns ON, and VO rises from the level of V1. Thus, the transistor 1006 changes from a non-saturated state to a saturated state. In this condition, further from formulas (1) and (3), input signal VIN that satisfies |Idsn|>>|Idsp2| is applied, and therefore, the above operation will be continued and the voltage of output terminal VON shifts from V2 to V1, while the voltage of output terminal VO shifts from V1 to V2, thereby completing the level shift circuit operation.

Next, in case the voltage V3 is lower than V2 when the input signal VIN is "H", then from formulas (1) and (2), the difference between |Idsn| and |Idsp1| is small, and the shifting speed of VON from V2 to V1 is slower than when the condition |Idsn|>>|Idsp1| is satisfied. Accordingly, during that time, a through-current will flow to the power source 1000 from the power source 1001 via the transistor 1006 and transistor 1004. When VON<(V2−|Vtp|) is satisfied at T3, the transistor 1007 turns ON, and VO slowly rises from V1 to V2. Thus, the transistor 1006 changes from a non-saturated state to a saturated state. In this condition, further from formulas (1) and (3), input signal VIN that satisfies |Idsn|>|Idsp2| is applied, and therefore, the above operation will be continued and the transistor 1006 turns OFF. In this way, the through-current stops flowing to the power source 1000 from the power source 1001 via the transistor 1006 and transistor 1004.

As a result of the above operation, VON shifts from V2 to V1, and VO shifts from V1 to V2, thereby completing the level shift circuit operation.

Also when the voltage of input signal VIN shifts from "H" to "L", the same operation as described above will be executed in the transistor 1005 and the transistor 1007.

In the conventional level shift circuit described above, when the voltage of input signal VIN shifts from "L" to "H", to achieve the purpose of changing the voltage of VON (and VO) at a high speed, it is required that, from formulas (1) and (2), the condition |Idsn|>>|Idsp1| be satisfied, and from formulas (1) and (3), the condition |Idsn|>>|Idsp2| be satisfied.

Accordingly, it is necessary to increase the area of the transistor 1004 (or transistor 1005), and there arises a problem of causing the layout area be increased.

The above problem obviously appears especially in case of low input signal VIN that makes it difficult to satisfy the conditions |Idsn|>>|Idsp1| and |Idsn|>>|Idsp2|.

Further, in logical inversion of input signal VIN, since there exists a length of time that causes both of the transistor 1006 (or transistor 1007) and the transistor 1004 (or transistor 1005) to turn ON, there arises a problem that a through-current flows to the power source 1000 from the power source 1001.

In order to solve such a problem that the circuit area is increased, for example, as disclosed in Japanese Laid-open Patent H2-188024, it is well known that various current feed circuits are arranged in parallel relation with the transistor 1006 and transistor 1007 of a level shift circuit based on prior art. However, this method is unable to solve a problem such that a sub-threshold current constantly flows when the area is increased due to increasing the number of elements or the current feed circuit is configured with transistors.

SUMMARY OF THE INVENTION

A level shift circuit comprising:

a first conduction type first transistor wherein a first power source voltage is supplied to a source, a first input signal is applied to a gate, and a first terminal is connected to a drain;

a first conduction type second transistor wherein a second input signal in reverse relation to the first input signal is applied to a gate, and a drain is connected to a second terminal;

a second conduction type third transistor wherein a second power source voltage is supplied to a source, and the first terminal is connected to a drain;

a second conduction type fourth transistor wherein a second terminal is connected to a drain;

a first gate voltage control circuit connected to the second terminal, input the second input signal, and making the third transistor turen ON when the first transistor is OFF; and a second gate voltage control circuit connected to the first terminal, input the first input signal, and making the fourth transistor turen ON when the second transistor is OFF.

A level shift circuit comprising:

a first conduction type second transistor wherein a first power source voltage is supplied to a source, a second input signal in reverse relation to a first input signal is applied to a gate, and a drain is connected to a second terminal;

a second conduction type fourth transistor wherein a second power source voltage is supplied to a source, and a second terminal is connected to a drain;

a second conduction type thirteenth transistor wherein the second power source voltage is supplied to a source;

a third gate voltage control circuit connected to the second terminal, input the second input signal, and making the thirteenth transistor turen ON when the second input signal is at a high level; and a fourth gate voltage control circuit connected to a drain of the thirteenth transistor, input the first input signal, and making the fourth transistor turen ON when the first input signal is at a high level.

BRIEF DESCRIPTION OF THE DRAWINGS

FIG. 2B is a timing chart of a level shift circuit in the exemplary embodiment 1 of the present invention.

DETAILED DESCRIPTION OF THE EXEMPLARY EMBODIMENT

The present invention is intended to solve the above conventional problems, to prevent the increase of the area occupied by circuits, and to decrease a through-current, and the object of the invention is to provide a level shift circuit capable of realizing high-speed operation.

(Exemplary Embodiment 1)

Figure 1:
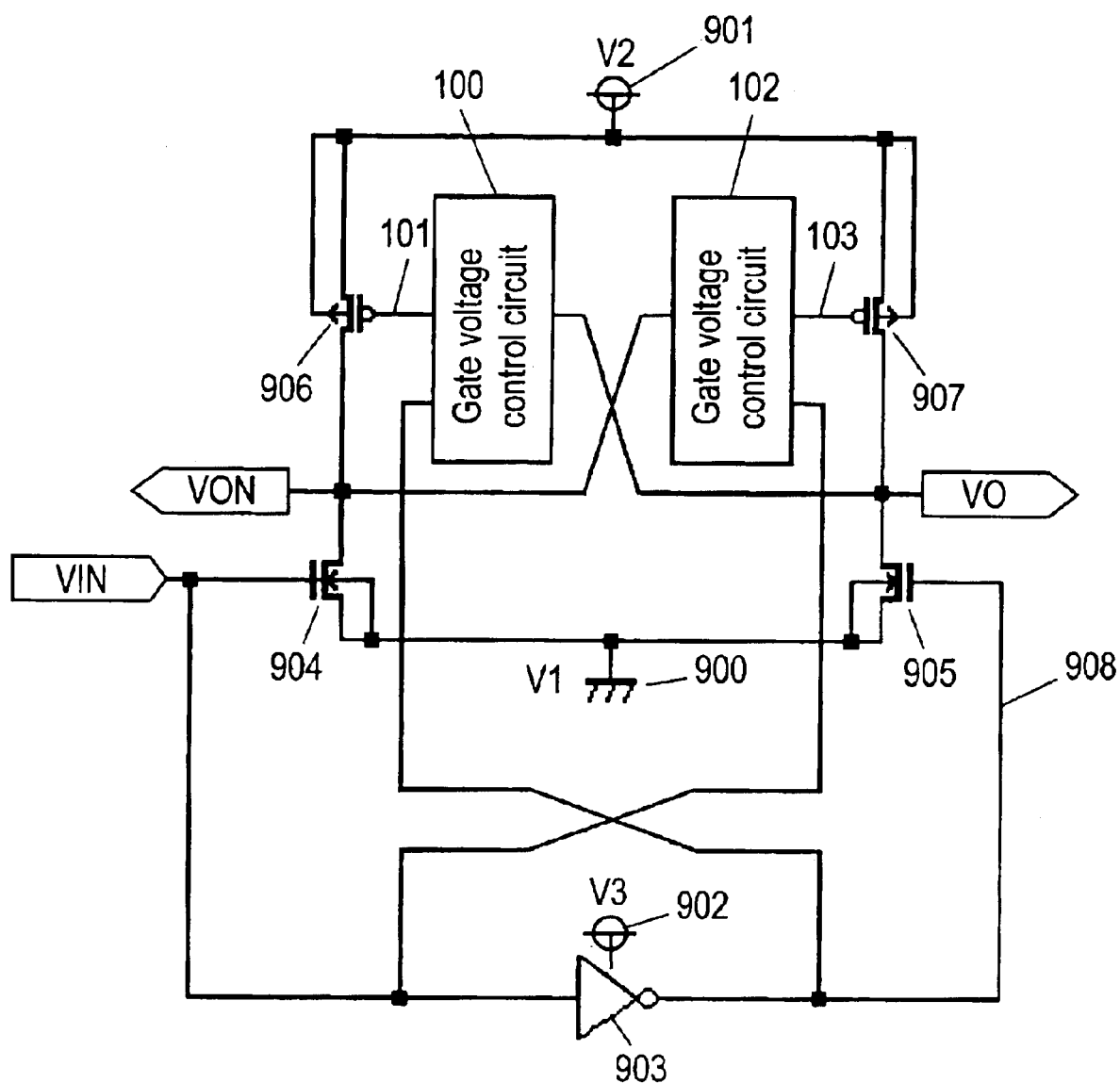
FIG. 1 is a schematic diagram of a level shift circuit in the exemplary embodiment 1 of the present invention.

FIG. 1 is a schematic diagram of a level shift circuit in the exemplary embodiment 1 of the present invention. In FIG. 1, the gate voltage control circuit 100 as the first gate voltage control circuit is connected to output terminal VO as the second terminal, and has output terminal 101. The gate voltage control circuit 102 as the second gate voltage control circuit is connected to output terminal VON as the first terminal, and has output terminal 103. The output terminal VO is a terminal which outputs a level-shifted signal same in phase as input signal VIN as the first input signal, and the output terminal VON is a terminal which outputs a level-shifted signal of the second input signal. The second input signal is reverse in phase to the input signal VIN.

The voltage of power source 900 is voltage level V1 as the first power source voltage, the voltage of power source 901 is voltage level V2 as the second power source voltage, and the voltage of power source 902 is voltage level V3 as the third power source voltage. The voltage level V3 is the amplitude voltage of input signal VIN, and the voltage level is same as the voltage level V2 or a different voltage level.

Inverter circuit 903 executes the logical inversion of input signal VIN. In the first conduction type transistor 904 (hereafter referred to as transistor 904) as the first transistor, V1 is supplied to the source, input signal VIN is applied to the gate, and output terminal VON is connected to the drain. In the first conduction type transistor 905 (hereafter referred to as transistor 905) as the second transistor, V1 is supplied to the source, the logically inverted signal of input signal VIN or signal 908 is applied to the gate, and the output terminal VO is connected to the drain. In the second conduction type transistor 906 (hereafter referred to as transistor 906) as the third transistor, V2 is supplied to the source, the output terminal 101 of gate voltage control circuit 100 is connected to the gate, and the output terminal VON is connected to the drain. In the second conduction type transistor 907 (hereafter referred to as transistor 907) as the fourth transistor, V2 is supplied to the source, the output terminal 103 of gate voltage control circuit 102 is connected to the gate, and the output terminal VO is connected to the drain. Signal 908 is reverse in phase to input signal VIN.

The present exemplary embodiment is characterized in that the gate voltage control circuit 100 controlled by the inverted signal 908 of input signal VIN is arranged between the gate of transistor 906 and the output terminal VO, and the gate voltage control circuit 102 controlled by the input signal VIN is arranged between the gate of transistor 907 and the output terminal VON.

Figure 2A:
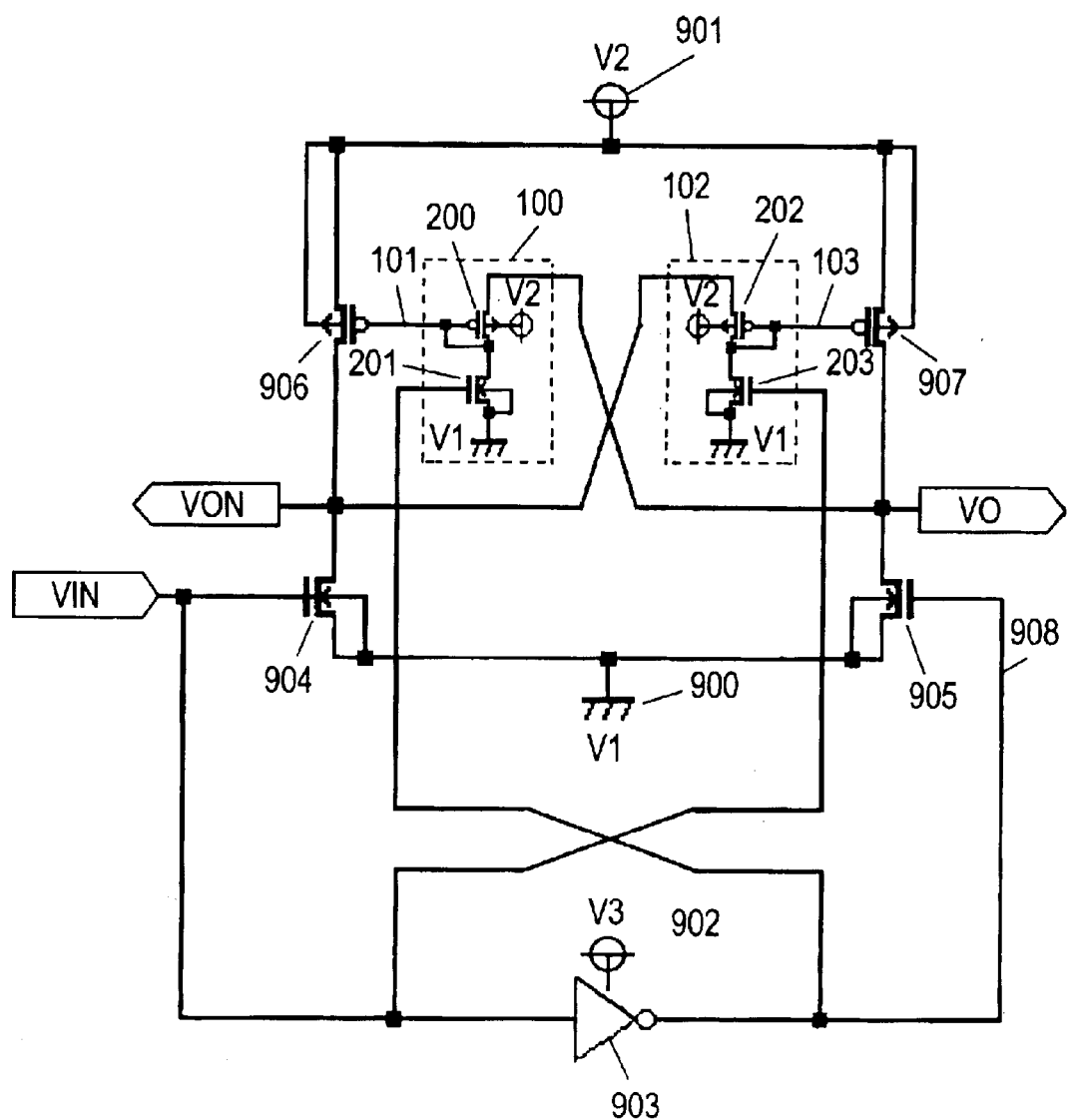
FIG. 2A is a diagram of a level shift circuit in the exemplary embodiment 1 of the present invention.

FIG. 2A shows a specific example of configuration of the gate voltage control circuit 100 and the gate voltage control circuit 102 of FIG. 1. In FIG. 2A, the gate voltage control circuit 100 is connected to the output terminal VO, and has the output terminal 101. The gate voltage control circuit 102 is connected to the output terminal VON, and has the output terminal 103. In the second conduction type transistor 200 (hereafter referred to as transistor 200) as the sixth transistor, the output terminal VO is connected to the source, and the gate and drain being in common connection are connected to the output terminal 101. In the first conduction type transistor 201 (hereafter referred to as transistor 201) as the fifth transistor, the inverted signal 908 of input signal VIN is applied to the gate, and the drain is connected to the drain of transistor 200. In the second conduction type transistor 202 (hereafter referred to as transistor 202) as the eighth transistor, the output terminal VON is connected to the source, and the gate and drain being in common connection are connected to the output terminal 103. In the first conduction type transistor 203 (hereafter referred to as transistor 203) as the seventh transistor, the input signal VIN is applied to the gate, and the drain of transistor 202 is connected to the drain. Incidentally, the same circuit elements and power sources as in FIG. 1 are given same reference numerals.

FIG. 2B is a timing chart of a level shift circuit showing the exemplary embodiment 1 of the present invention. The operation will be described by using FIG. 2A and FIG. 2B.

When the voltage of input signal VIN is "L", the voltage of signal 908 is "H". Accordingly, the transistor 904 and the transistor 203 are OFF, while the transistor 905 and the transistor 201 are ON. Also, the voltage of output terminal VO is V1, and the transistor 906 turns ON. Therefore, the voltage of output terminal VON is V2. Since the voltage of output terminal VON is given to the gate of transistor 907 from the output terminal 103 of gate voltage control circuit 102 via the transistor 202, the gate voltage of transistor 907 is V21 that is a little lower than V2. Therefore, the transistor 907 is nearly in a state of being OFF.

In the above condition, when the voltage of input signal VIN shifts from "L" to "H" at time T1, the voltage of signal 908 simultaneously shifts from "H" to "L". Thus, the transistor 904 and the transistor 203 change from OFF to ON, while the transistor 905 and the transistor 201 change from ON to OFF. Accordingly, the voltage of output terminal 103 applied to the gate of transistor 907 lowers from the level of V21 and reaches a certain level of voltage according to the drain current of transistor 203. At time T2, the transistor 907 that satisfies the condition (voltage of output terminal 103)<(V2−|Vtp|) turns ON. Then, the voltage of output terminal VO rises from the level of V1. The voltage of output terminal VO is supplied to the gate of transistor 906 from the output terminal 101 of gate voltage control circuit 100 via the transistor 200 that has diode characteristics. Therefore, the gate voltage of transistor 906 rises at time T3 that is later than T2. At time T4, the drain current of transistor 906 becomes less, and the voltage of output terminal VON begins rapidly lowering from the level of V2. The voltage of output terminal VON is supplied to the gate of transistor 907 via the transistor 202 that has diode characteristics. Accordingly, the gate voltage of transistor 907 becomes lowered at time T5 that is later than T4.

Through the above operation, while the voltage of input signal VIN is "H", the gate voltage of transistor 907 becomes V1, the transistor 907 keeps turning ON, and the transistor 905 is OFF, therefore the voltage of output terminal VO keeps the level of V2. On the other hand, the gate voltage of transistor 906 becomes V21, and the transistor 906 nearly keeps turning OFF although a sub-threshold current flows therefrom, and since the transistor 904 is ON, the voltage of output terminal VON keeps the level of V1. In this way, the operation will be completed.

Also, when the input signal VIN shifts from "H" to "L", switching is similarly performed by the operation of the gate voltage control circuit 100 the same as described above.

In this exemplary embodiment 1, even in case the voltage V3 of input signal VIN at "H" is lower than V2, when the input signal VIN shifts from "L" to "H", both of the transistor 904 and transistor 906 are ON, but the transistor 203 of the gate voltage control circuit 102 turns ON. Accordingly, since the voltage of output terminal 103 becomes lower than V21, the drain current of the transistor 906 is suppressed. That is, irrespective of the ratio of drain current levels of transistor 904 and transistor 906, the voltage of the output terminal changes at a high speed and the through-current is decreased, thereby achieving the purpose of power saving.

Also, the switching speed of output terminal VON (or output terminal VO) corresponding to the shift of the input signal VIN is not related to the ratio of drain current levels of transistor 904 (or transistor 905) and transistor 906 (or transistor 907). Therefore, even in case the amplitude voltage of the input signal is low in particular, it is not necessary to increase the layout area of transistor 904 (or transistor 905) for increasing the speed, and it becomes possible to reduce the layout area.

According to the configuration shown in this exemplary embodiment 1, when the first transistor changes from ON to OFF, the third transistor is turned ON by the first gate voltage control circuit, and then the voltage level of the first terminal rises. After that, the fourth transistor is turned OFF by the second gate voltage control circuit, and the voltage level of the second terminal is lowered by the second transistor. Also when the second transistor is OFF, the operation is similarly performed by the second gate voltage control circuit the same as described above. The above operation is not related at all to the ratio of drain current levels of the first transistor and the third transistor. Similarly, it is not related to the ratio of drain current levels of the second transistor and the fourth transistor either. Accordingly, it is possible to realize high-speed switching operation. Also, since it is not necessary to take into account the ratio of sizes of the first transistor and the third transistor, and the ratio of sizes of the second transistor and the fourth transistor, it is possible to decrease the layout area of the first and second transistors.

Also, according to the configuration shown in the exemplary embodiment 1, when the first transistor changes from ON to OFF, the sixth transistor has diode characteristics. Therefore, it is possible to lower the gate voltage of the third transistor by at least the threshold voltage from the second power source voltage level by means of the fifth transistor that is relatively small in area. And, since the third transistor can be easily turned ON, it is possible to execute high-speed switching. Also when the second transistor changes from ON to OFF, the operation will be similarly performed by the eighth and the fourth transistors. Also, when the first transistor is OFF, since the source of the sixth transistor is connected to the second terminal, the source voltage level of the sixth transistor can be equalized in potential to the source voltage level of the fifth transistor. And, the third transistor can be kept in a state of being ON. Same holds true with respect to the operation of the eighth transistor, the seventh transistor, and the fourth transistor, with the second transistor is OFF. Accordingly, only by adding four transistors which are relatively small in area, it is possible to perform higher-speed operation as compared with a conventional level shift circuit even when the first and the second input signals VIN are at a low level. Also, it is possible to decrease the layout area as compared with a conventional level shift circuit taking into account low-voltage operation.

(Exemplary embodiment 2)

Figure 3A:
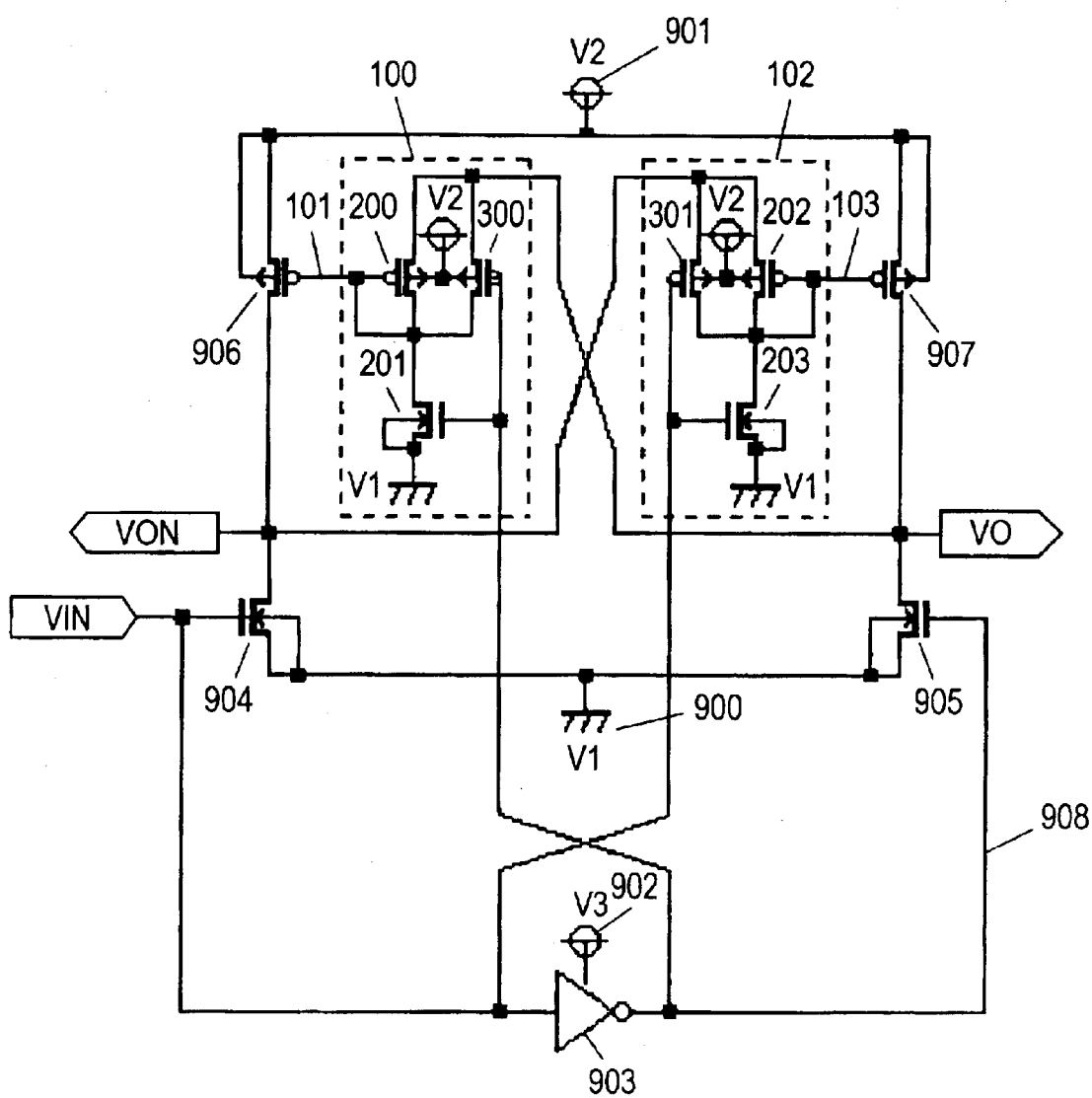
FIG. 3A is a diagram of a level shift circuit in the exemplary embodiment 2 of the present invention.

FIG. 3A is a diagram of a level shift circuit in the exemplary embodiment 2 of the present invention. In FIG. 3A, the gate voltage control circuit 100 is connected to output terminal VO, and has output terminal 101. The gate voltage control circuit 102 is connected to output terminal VON, and has output terminal 103. In transistor 200, output terminal VO is connected to the source, and the gate and drain being in common connection are connected to output terminal 101. In transistor 201, the inverted signal 908 of input signal VIN is applied to the gate, and the drain is connected to the drain of transistor 200. In transistor 202, output terminal VON is connected to the source, and the gate and drain being in common connection are connected to output terminal 103. In transistor 203, input signal VIN is applied to the gate, and the drain is connected to the drain of transistor 202. The second conduction type transistor 300 (hereafter referred to as transistor 300) as the ninth transistor is controlled by the inverted signal of input signal VIN and is connected between the terminal VO and the drain of transistor 200. The second conduction type transistor 301 (hereafter referred to as transistor 301) as the tenth transistor is controlled by input signal VIN and is connected between the output terminal VON and the drain of transistor 202.

Here, the drain current with transistor 300 turned ON is 1/N (N is a value larger than 1) as against the drain current with transistor 201 turned ON, and the drain current with transistor 301 turned ON is set to 1/N (N is a value larger than 1) as against the drain current with transistor 203 turned ON.

Incidentally, same circuit elements, power sources, and signals as those in FIG. 1 are given same reference numerals.

Figure 3B:
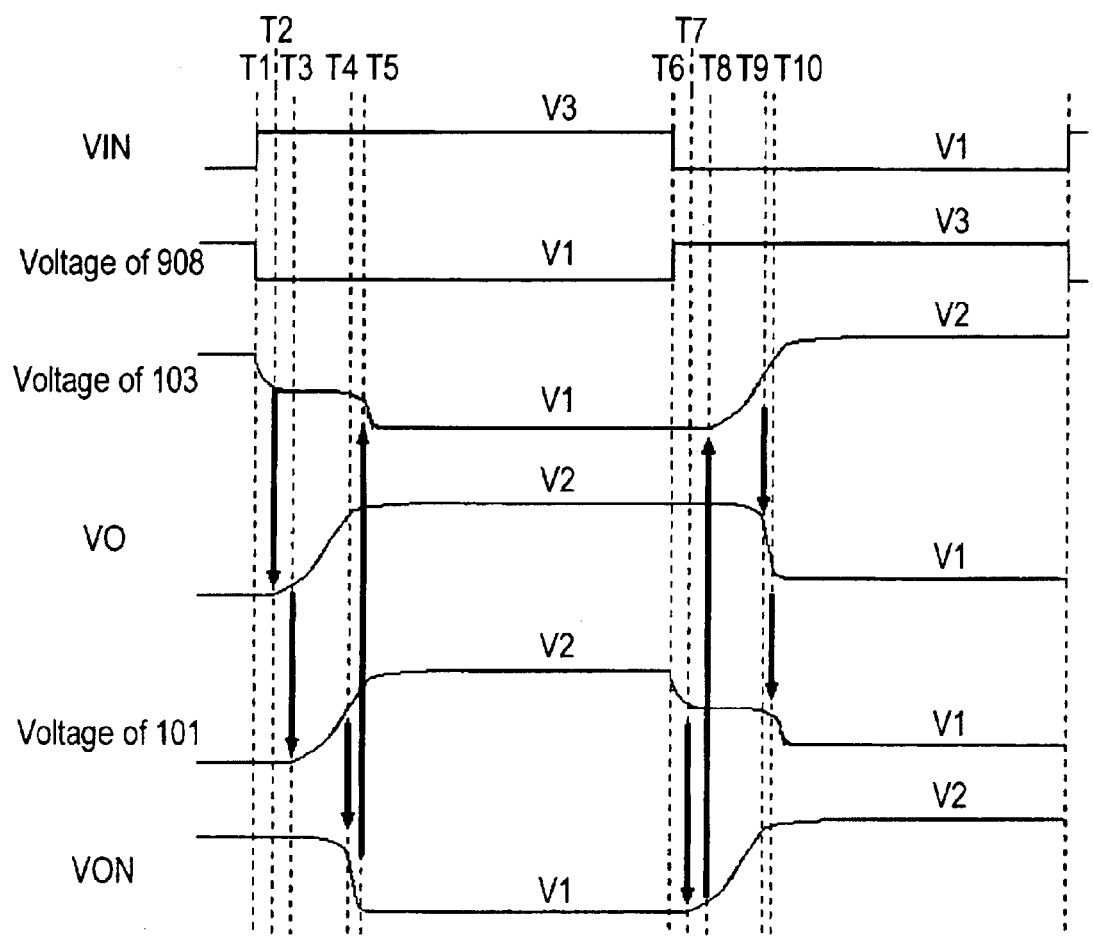
FIG. 3B is a timing chart of a level shift circuit in the exemplary embodiment 2 of the present invention.

FIG. 3B is a timing chart of a level shift circuit in the exemplary embodiment 2 of the present invention. The operation will be described in the following by using FIG. 3A and FIG. 3B.

When the voltage of input signal VIN is "L", the voltage of signal 908 is "H". Accordingly, the transistor 904, transistor 203, and transistor 300 are OFF, while the transistor 905, transistor 201, and transistor 301 are ON. Also, the voltage of output terminal VO is V1, and the transistor 906 turns ON. Thus, the voltage of output terminal VON is V2. The voltage V2 of output terminal VON is given to the gate of transistor 907 from the output terminal 103 of gate voltage control circuit 102 via the transistor 301. Accordingly, the gate voltage of transistor 907 is V2, and the transistor 907 is OFF.

In the above condition, when the voltage of input signal VIN shifts from "L" to "H" at time T1, the voltage of signal 908 simultaneously shifts from "H" to "L". Thus, the transistor 904 and transistor 203 change from OFF to ON, while the transistor 905 and transistor 201 change from ON to OFF.

Then, the transistor 300 and the transistor 301 change in gate voltage as the input signal VIN changes, but both of them turn OFF. Thus, the gate voltage of transistor 907 lowers from the level of V2 and reaches a predetermined voltage according to the drain current of transistor 203. When the transistor 907 turns ON at time T2, the voltage of output terminal VO rises from the level of V1. The voltage of output terminal VO is supplied to the gate of transistor 906 from the output terminal 101 of gate voltage control circuit 100 via the transistor 200 having diode characteristics and the transistor 300 of less drain current in a state of turning ON. Therefore, the gate voltage of transistor 906 rises at T3 that is later than T2. When the drain current of transistor 906 begins to decrease at T4, the voltage of output terminal VON begins to decrease from the level of V2. The voltage of output terminal VON is supplied to the gate of transistor 907 from the output terminal 103 of gate voltage control circuit 102 via the transistor 202 having diode characteristics and the transistor 301 of less drain current. Therefore, the voltage of gate 103 of transistor 907 lowers to the level of V1 at time T5 that is later than T4.

Through the above operation, while the voltage of input signal VIN is "H", the gate voltage of transistor 907 becomes V1 and the transistor 907 keeps ON and the transistor 905 is OFF, therefore the voltage of output terminal VO keeps the level of V2. On the other hand, the gate voltage of transistor 906 becomes voltage V2 of output terminal 101 which is outputted via the transistor 300 in a state of being ON and the transistor 200 that has diode characteristics, and the transistor 906 keeps OFF without flow of a sub-threshold current. Since the transistor 904 is ON, the voltage of output terminal VON keeps the level of V1. Thus, the operation will be completed.

Also, when the voltage of input signal VIN shifts from "H" to "L", switching is similarly performed by the operation of the gate voltage control circuit 100 the same as described above.

In this exemplary embodiment 2, transistor 300 (or transistor 301) which is applied the inverted signal 908 (or input signal VIN) of the input signal to the gate is additionally connected to the exemplary embodiment 1 in parallel relation with the transistor 200 (or transistor 202) of the gate voltage control circuit 100 (or gate voltage control circuit 102).

In this way, the amplitude voltage of output terminal 101 (or output terminal 103) of the gate voltage control circuit becomes V2, and the sub-threshold current of transistor 906 (or transistor 907) can be eliminated, thereby giving rise to the effect of lessening the through-current. For the others, the effects obtained are same as in the exemplary embodiment 1.

By using the above configuration, with the first transistor being ON and the fifth transistor being OFF, the gate voltage of the third transistor can be equalized in potential to the second power source voltage via the ninth transistor. Thus, the third transistor can be completely turned OFF. Accordingly, the sub-threshold current that constantly flows via the third transistor when the first transistor is ON can also be eliminated. Therefore, it is possible to reduce the current consumed. Also when the second transistor is ON, the sub-threshold current of the fourth transistor can be eliminated by disposing the tenth transistor, and thereby, similar effects can be obtained the same as described above. Also, since there are provided the first and the second gate voltage control circuits, it is possible to perform high-speed switching even in low voltage operation.

(Exemplary Embodiment 3)

Figure 4A:
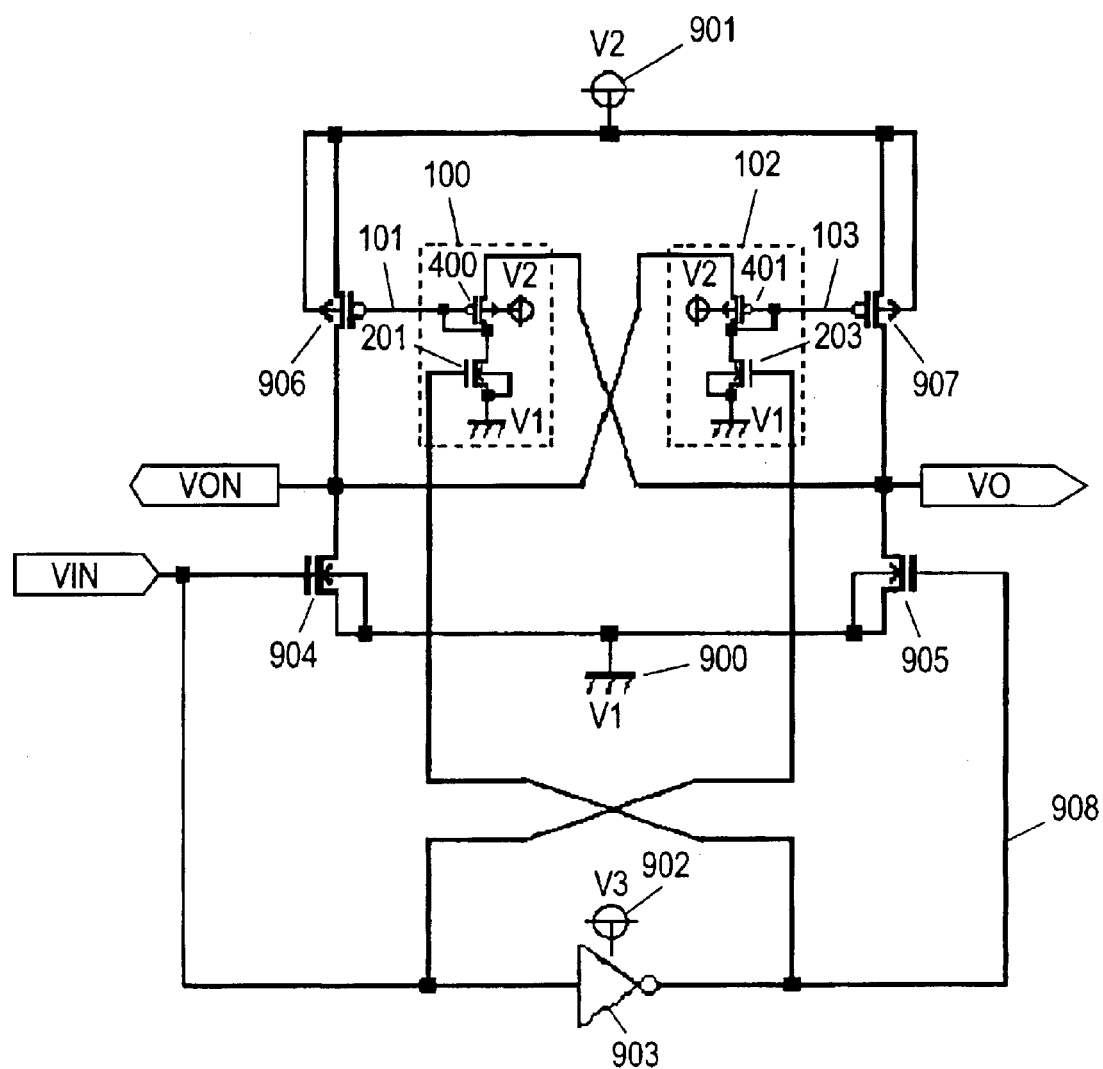
FIG. 4A is a diagram of a level shift circuit in the exemplary embodiment 3 of the present invention.

FIG. 4A is a diagram of a level shift circuit in the exemplary embodiment 3 of the present invention.

In FIG. 4A, the gate voltage control circuit 100 is connected to output terminal VO, and has output terminal 101. The gate control circuit 102 is connected to output terminal VON, and has output terminal 103. In the second conduction type depression transistor 400 (hereafter referred to as transistor 400) as the eleventh transistor, the source is connected to output terminal VO, and the gate and drain being in common connection, drain current flows even when the gate-source voltage is 0V. In transistor 201, the inverted signal of input signal VIN is applied to the gate, and the drain is connected to the drain of transistor 400. In the second conduction type depression transistor 401 (hereafter referred to as transistor 401) as the twelfth transistor, the source is connected to output terminal VON, and the gate and drain being in common connection, drain current flows even when the gate-source voltage is 0V. In transistor 203, input signal VIN is applied to the gate, and the drain is connected to the drain of transistor 401. For a transistor not designated as a depression transistor, it stands for an enhancement transistor.

Incidentally, same circuit elements, power sources and signals as those in FIG. 1 are given same reference numerals, and the description is omitted.

Figure 4B:
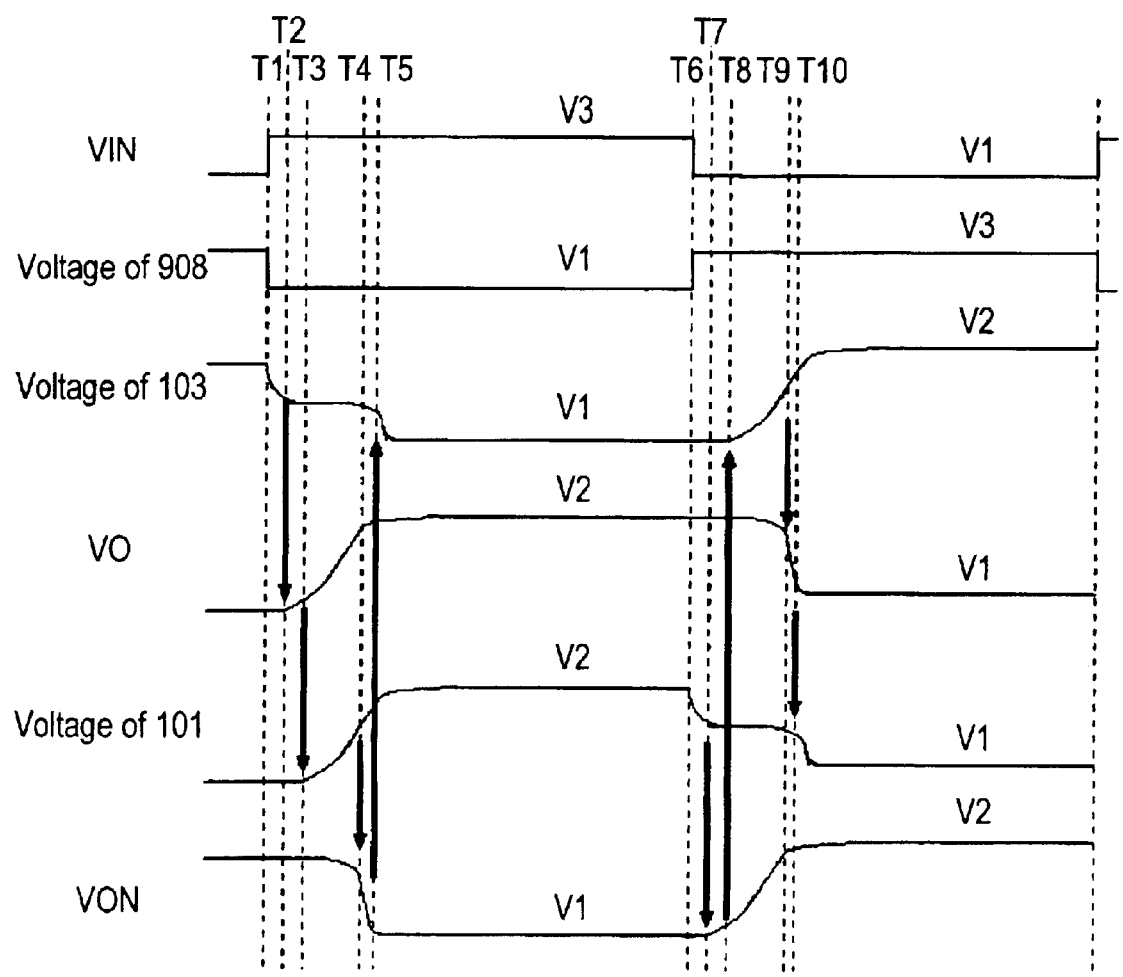
FIG. 4B is a timing chart of a level shift circuit in the exemplary embodiment 3 of the present invention.

FIG. 4B is a timing chart of a level shift circuit in the exemplary embodiment 3 of the present invention. The operation will be described by using FIG. 4A and FIG. 4B.

When the voltage of input signal VIN is "L", the voltage of signal 908 is "H". Accordingly, the transistor 904 and transistor 203 are OFF, while the transistor 905 and transistor 201 are ON. The voltage of output terminal VO is V1, and the transistor 906 turns ON. Therefore, the voltage of output terminal VON is V2. Since the voltage V2 of output terminal VON is given to the gate of transistor 907 from the output terminal 103 of gate voltage control circuit 102 via the transistor 401, the gate voltage of transistor 907 is V2. And, the transistor 907 is OFF.

In the above condition, when the voltage of input signal VIN shifts from "L" to "H" at time T1, the voltage of signal 908 simultaneously shifts from "H" to "L". Thus, the transistor 904 and transistor 203 change from OFF to ON, and the transistor 905 and transistor 201 change from ON to OFF. Accordingly, the voltage of gate 103 of transistor 907 lowers from the level of V2 and reaches a certain level of voltage according to the drain current of the transistor 203.

When (the voltage of output terminal 103)<(V2−|Vtp|) is satisfied at time T2, causing the transistor 907 to turn ON, then the voltage of output terminal VO rises from the level of V1. Since the voltage of output terminal VO is supplied to the gate of transistor 906 from the output terminal 101 of the gate voltage control circuit 100 via the transistor 400, the gate voltage of transistor 906 rises at time T3 that is later than time T2. At time T4, the drain current of transistor 906 is suppressed, then the voltage of output terminal VON begins rapidly lowering from the level of V2. Since the voltage of output terminal VON is supplied to the gate of transistor 907 from the output terminal 103 of the gate voltage control circuit 102 via the transistor 401, the gate voltage of transistor 907 lowers at time T5 that is later than time 4.

Through the above operation, while the voltage of input signal VIN is "H", the gate voltage of transistor 907 becomes V1 and the transistor 907 keeps ON and the transistor 905 is OFF. Therefore, the voltage of output terminal VO keeps the level of V2.

On the other hand, the gate voltage of transistor 906 becomes V2, and the transistor 906 keeps OFF and the transistor 904 is ON, therefore the voltage of output terminal VON keeps the level of V1. Thus, the operation will be completed.

Also, when the voltage of input signal VIN shifts from "H" to "L", switching is similarly performed by the operation of the gate voltage control circuit 100 the same as described above.

In this exemplary embodiment 3, the number of elements can be reduced by using a depression transistor as the transistor 400 (or transistor 401) of the gate voltage control circuit 100 (or gate voltage control circuit 102). Besides, the amplitude voltage of output terminal 101 (or output terminal 103) becomes V2, and the same effects as in the exemplary embodiment 2 can be obtained.

According to the configuration of this exemplary embodiment, when the first transistor is ON and the fifth transistor is OFF, the gate voltage of the third transistor can be equalized in potential to the second power source voltage via the eleventh transistor. Therefore, the third transistor can be completely turned OFF. Accordingly, the sub-threshold current that constantly flows via the third transistor when the first transistor is ON can be eliminated. Thus, it is possible to reduce the current consumed. Also when the second transistor is ON, the sub-threshold current of the fourth transistor can be eliminated by disposing the twelfth transistor, thereby obtaining the same effects as described above. Also, since there are provided the first and the second gate voltage control circuits, it is possible to perform high-speed switching even in low-voltage operation.

(Exemplary Embodiment 4)

Figure 5:
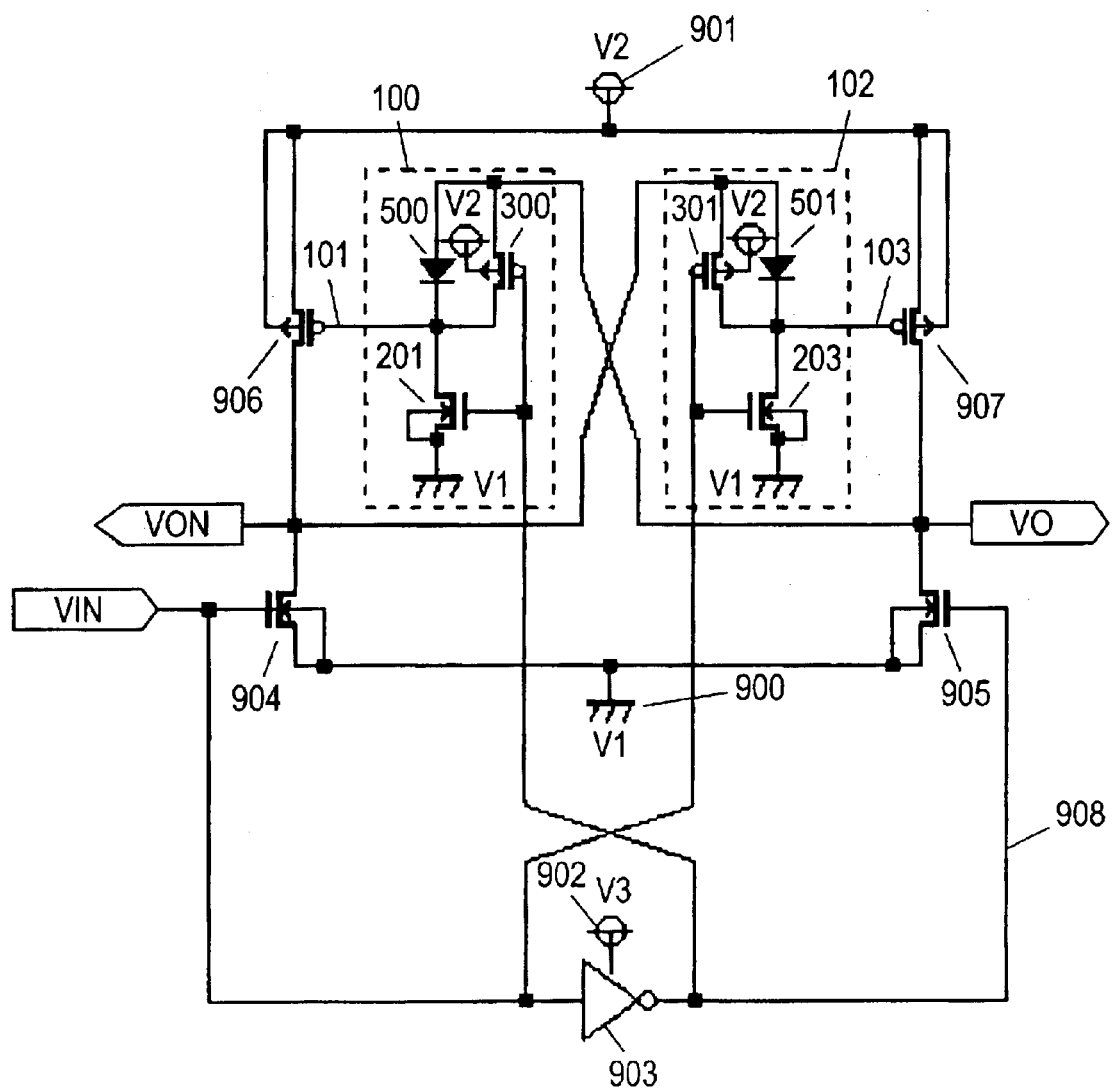
FIG. 5 is a diagram of a level shift circuit in the exemplary embodiment 4 of the present invention.

FIG. 5 shows a diagram of a level shift circuit in the exemplary embodiment 4. In the exemplary embodiment 4, the transistor 200 of the exemplary embodiment 2 is replaced with diode 500, and the transistor 202 is replaced with diode 501.

Also in FIG. 5, with the input signal VIN chainging, the transistor 904 and transistor 203 change from OFF to ON, while the transistor 905 and transistor 201 change from ON to OFF. Accordingly, the gate voltage of transistor 907 becomes lowered and the transistor 907 turns ON, causing the voltage of output terminal VO to rise from the level of V1, and the transistor 906 turns OFF, causing the voltage of output terminal VON to become lowered. Therefore, in the exemplary embodiment 4, high-speed switching can be performed the same as in the exemplary embodiment 2.

In this exemplary embodiment 4, the diode 500 (or diode 501) is connected in parallel relation with the transistor 300 (or transistor 301) of the gate voltage control circuit 100 (or gate voltage control circuit 102), and thereby, the circuit configuration is simplified and the same effects as in the exemplary embodiment 2 can be obtained.

(Exemplary embodiment 5)

Figure 6:
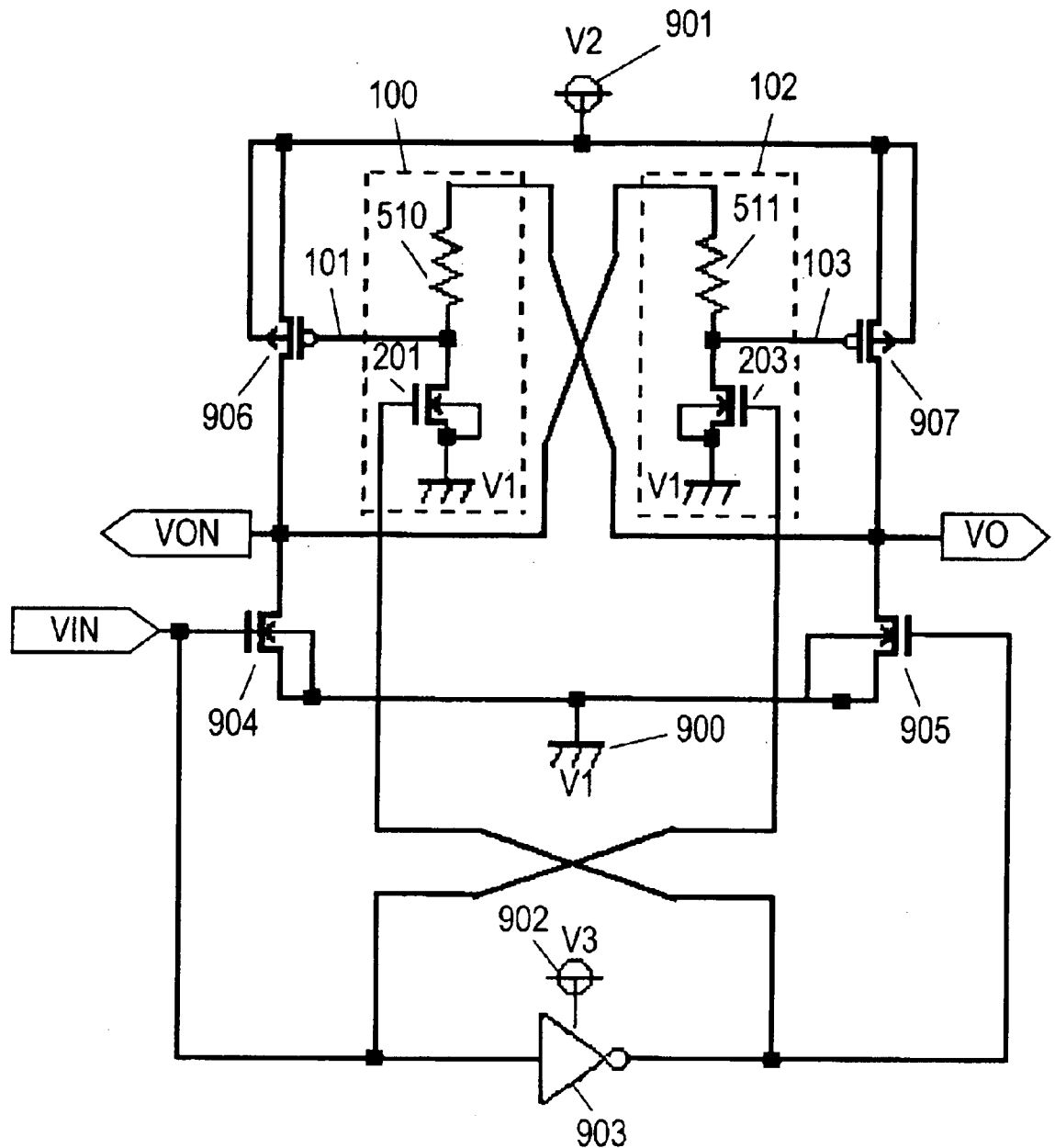
FIG. 6 is a diagram of a level shift circuit in the exemplary embodiment 5 of the present invention.

FIG. 6 shows a diagram of a level shift circuit in the exemplary embodiment 5. In the exemplary embodiment 5, the transistor 400 of the exemplary embodiment 3 is replaced with resistor 510, and the transistor 401 is replaced with resistor 511.

Also in FIG. 6, when the voltage of input signal VIN shifts from "L" to "H", the transistor 904 and transistor 203 change from OFF to ON, while the transistor 905 and transistor 201 change from ON to OFF. Accordingly, as the voltage of resistor 511 is lowered, the gate voltage of transistor 907 becomes lowered, and the transistor 907 turns ON, causing the voltage of output terminal VO to rise from the level of V1 and the transistor 906 to turn OFF. In this way, since the voltage of output terminal VON becomes lowered, the exemplary embodiment 5 is capable of performing switching operation the same as in the exemplary embodiment 3.

In the exemplary embodiment 5, the drain of transistor 201 (or transistor 203) of the gate voltage control circuit 100 (or gate voltage control circuit 102) and the output terminal VO (or output terminal VON) are connected by resistor 510 (or resistor 511), and thereby, the circuit configuration is simplified, and the same effects as in the exemplary embodiment 3 can be obtained.

(Exemplary Embodiment 6)

Figure 7:
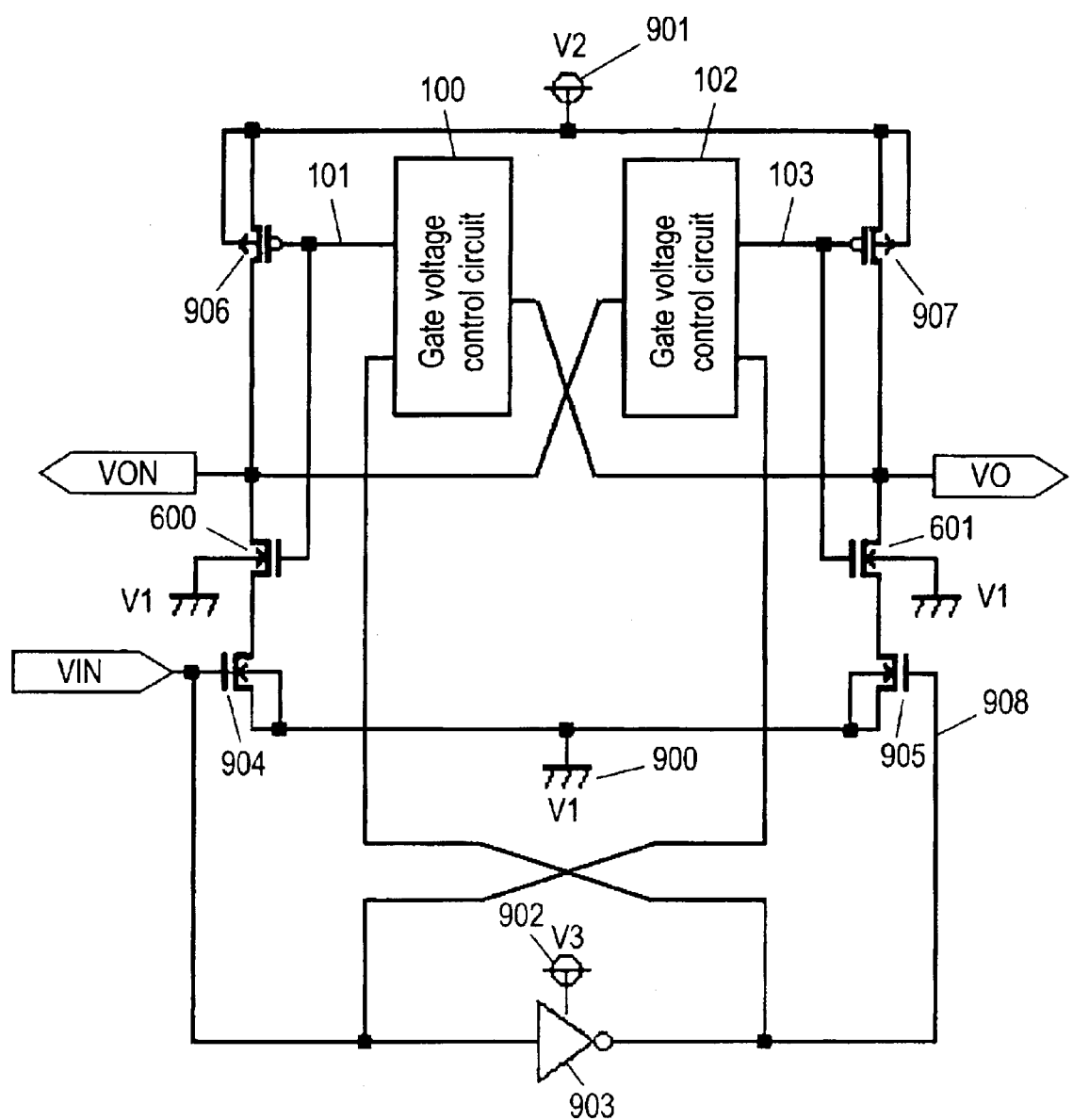
FIG. 7 is a schematic diagram of a level shift circuit in the exemplary embodiment 6 of the present invention.

FIG. 7 is a diagram showing the configuration of a level shift circuit in the exemplary embodiment 6 of the present invention. In FIG. 7, the gate voltage control circuit 100 is connected to output terminal VO, and has output terminal 101. The gate voltage control circuit 102 is connected to output terminal VON, and has output terminal 103. In the first conduction type transistor 600 (hereafter referred to as transistor 600), the gate of transistor 906 and the gate being in common connection are connected to output terminal 101, and connected between the output terminal VON and the transistor 904. In the first conduction type transistor 601 (hereafter referred to as transistor 601), the gate of transistor 907 and the gate being in common connection are connected to output terminal 103, and connected between the output terminal VO and the transistor 905. The transistor 600 is a configuration example of the first switching circuit having a switching means. Also, the transistor 601 is a configuration example of the second switching circuit having a switching means.

The output terminal VO is a terminal which outputs a level-shifted signal same in phase as the input signal VIN, and the output terminal VON is a terminal which outputs a level-shifted signal reverse in phase to the input signal VIN. The voltage level of power source 900 is V1, the voltage level of power source 901 is V2, and the voltage level of power source 902 is V3. The voltage level V3 is the amplitude voltage of input signal VIN. This is a voltage level same as the level of V2 or a different voltage level. Inverter circuit 903 executes the logical inversion of input signal VIN. In the transistor 904, V1 is supplied to the source, input signal VIN is applied to the gate, and the source of transistor 600 is connected to the drain. In the transistor 905, V1 is supplied to the source, the logically inverted signal of input signal VIN is applied to the gate, and the source of transistor 601 is connected to the drain. In the transistor 906, V2 is supplied to the source, the output terminal 101 of the gate voltage control circuit 100 is connected to the gate, and the output terminal VON is connected to the drain. In the transistor 907, V2 is supplied to the source, the output terminal 103 of the gate voltage control circuit 102 is connected to the gate, and the output terminal VO is connected to the drain. The signal 908 is a signal reverse in phase to the input signal VIN.

Figure 8A:
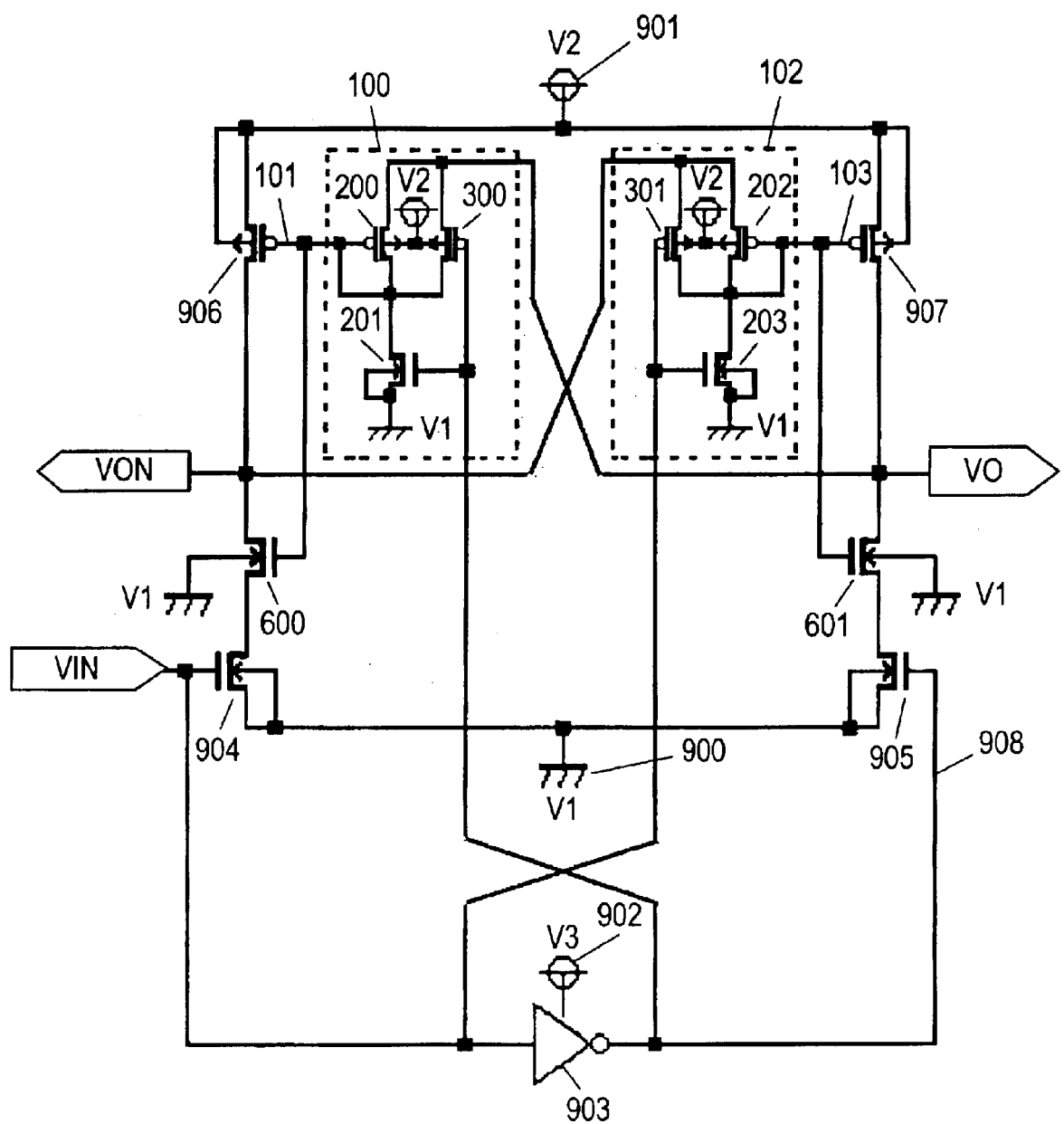
FIG. 8A is a diagram of a level shift circuit in the exemplary embodiment 6 of the present invention.

An example of specific circuit and the operation of FIG. 7 will be described by using FIG. 8A and FIG. 8B. FIG. 8A is a diagram of a level shift circuit in the exemplary embodiment 6 of the present invention.

In FIG. 8A, the gate voltage control circuit 100 is connected to output terminal VO, and has output terminal 101. The gate voltage control circuit 102 is connected to output terminal VON, and has output terminal 103. In the transistor 200, the output terminal VO is connected to the source, and the gate and drain are connected to the output terminal 101. In the transistor 201, the inverted signal 908 of input signal VIN is applied to the gate, and the drain is connected to the drain of transistor 200. In the transistor 202, the output terminal VON is connected to the source, while the gate and drain are connected to the output terminal 103. In the transistor 203, the input signal VIN is connected to the gate, and the drain is connected to the drain of transistor 202. The transistor 300 is controlled by the inverted signal 908 of input signal VIN, and is connected between the output terminal VO and the drain of transistor 200. The transistor 301 is controlled by the input signal VIN, and is connected between the output terminal VON and the drain of transistor 202.

Here, the drain current with transistor 300 being ON is 1/N (N is a value larger than 1) as against the drain current with transistor 201 being ON, and the drain current with transistor 301 being ON is set to 1/N (N is a value larger than 1) as against the drain current with transistor 203 being ON.

The transistor 600 is in common connection with the transistor 906 with respect to the gate, and is connected between the output terminal VON and the transistor 904. The transistor 601 is in common connection with the transistor 907 with respect to the gate, and is connected between the output terminal VO and the transistor 905.

Incidentally, VIN is input signal, VO is a terminal which outputs a level-shifted signal same in phase as the input signal VIN, and VON is a terminal that outputs a level-shifted signal reverse in phase to the input signal VIN. The voltage level of power source 900 is V1, the voltage level of power source 901 is V2, and the voltage level of power source 902 is V3. The voltage level V3 is the amplitude voltage of input sign VIN, which is same in voltage level as V2 or a different voltage level. The inverter circuit 903 executes the logical inversion of the input signal VIN. In the transistor 904, V1 is supplied to the source, the input signal VIN is applied to the gate, and the source of transistor 600 is connected to the drain. In the transistor 905, V1 is supplied to the source, the logically inverted signal 908 of input signal VIN is applied to the gate, and the source of transistor 601 is connected to the drain. In the transistor 906, V2 is supplied to the source, the output terminal 101 of the gate voltage control circuit 100 is connected to the gate, and the output terminal VON is connected to the drain. In the transistor 907, V2 is supplied to the source, the output terminal 103 of the gate voltage control circuit 102 is connected to the gate, and the output terminal VO is connected to the drain. The signal 908 is a signal reverse in phase to the input signal VIN.

Figure 8B:
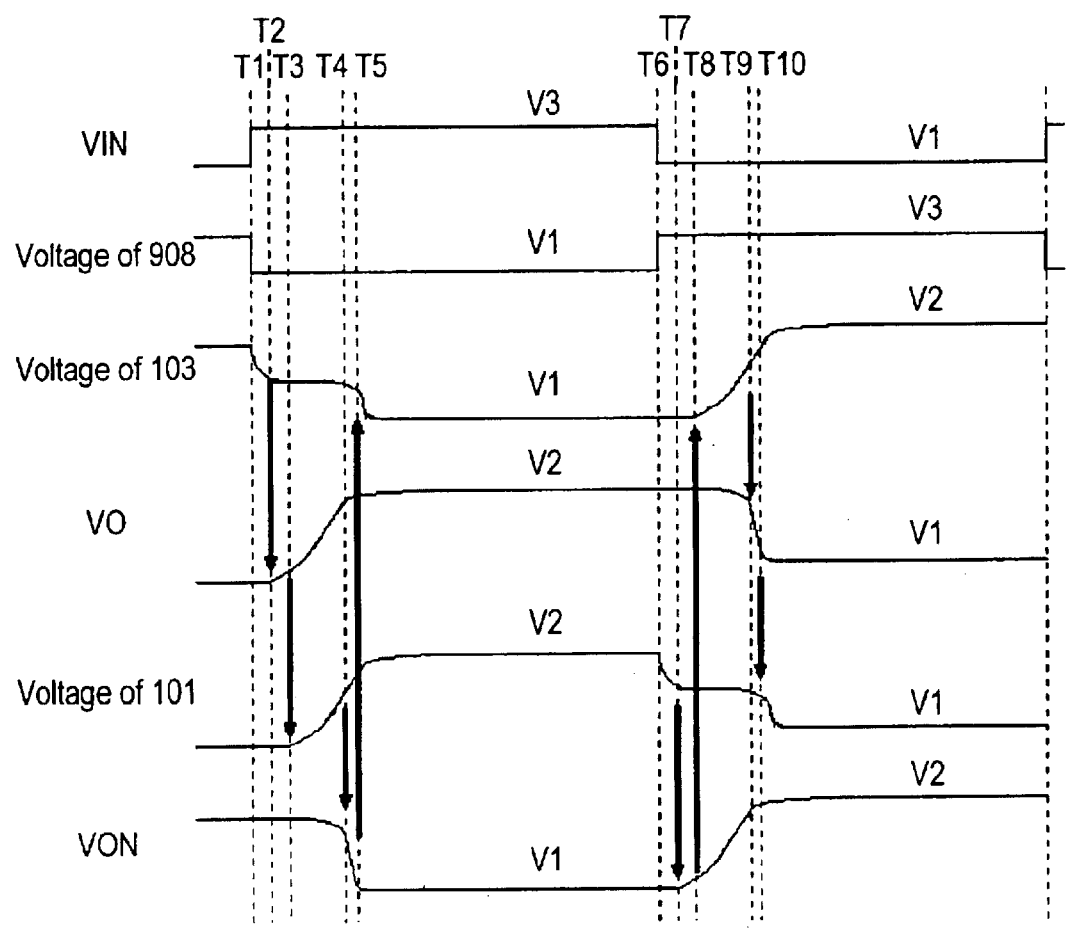
FIG. 8B is a timing chart of a level shift circuit in the exemplary embodiment 6 of the present invention.

FIG. 8B is a timing chart of a level shift circuit in the exemplary embodiment 6 of the present invention. The operation will be described by using FIG. 8A and FIG. 8B.

When the voltage of input signal VIN is "L", the voltage of signal 908 is "H". Accordingly, the transistor 904, transistor 203, and transistor 300 are OFF, while the transistor 905, transistor 201, and transistor 301 are ON. The voltage of output terminal VO is V1, then the transistor 906 turns ON and the transistor 600 turns OFF. Therefore, the output terminal VON is V2. Since the voltage V2 of output terminal VON is given to the gate of transistor 907 from the output terminal 103 of the gate voltage control circuit 102 via the transistor 301, the gate voltage of transistor 907 is V2. Accordingly, the transistor 907 is OFF, and the transistor 601 is ON.

In the above condition, when the voltage of input signal VIN shifts from "L" to "H" at time T1, the voltage of signal 908 simultaneously shifts from "H" to "L". Thus, the transistor 904 and transistor 203 change from OFF to ON, while the transistor 905 and transistor 201 change from ON to OFF.

Then, the transistor 300 and transistor 301 change in gate voltage due to the input signal VIN, and both of them turn OFF. At the time, the transistor 906, transistor 904, and transistor 601 turn ON, while the transistor 907, transistor 905, and transistor 600 turn OFF. Both of the transistor 906 and transistor 904 turn ON, but since the gate voltage of transistor 906 is V1, the transistor 600 is OFF. Accordingly, there is no flow of through-current to the power source 900 from the power source 901 via the transistor 906 and the transistor 904.

Since the transistor 203 of the gate voltage control circuit 102 is ON, the voltage of output terminal 103 becomes lowered, and the gate voltage of transistor 907 lowers from the level of V2. At the same time, the ON resistance of transistor 601 is increased. When (the voltage of output terminal 103)<(V2−|Vtp|) is satisfied at time T2, the transistor 907 turns ON, and the voltage of output terminal VO rises from the level of V1. The voltage of output terminal VO is supplied to the gate of transistor 906 from the output terminal 101 of the gate voltage control circuit 100 via the transistor 200 that has diode characteristics and the transistor 300 that is low in the level of drain current. Therefore, the gate voltage of transistor 906 rises at time T3 that is later than time T2. At the same time, the ON resistance of transistor 600 is decreased. At time T4, the ON resistance of transistor 600 is sufficiently decreased, while the ON resistance of transistor 906 is increased, then the voltage of output terminal VON begins to lower from the level of V2. The voltage of output terminal VON is supplied to the gate of transistor 907 from the output terminal 103 of the gate voltage control circuit 102 via the transistor 202 that has diode characteristics and the transistor 301 that is low in the level of drain current. Accordingly, the gate voltage of transistor 907 becomes lowered at time T5 that is later than time T4.

Through the above operation, while the voltage of input signal VIN is "H", the voltage of output terminal 103 becomes V1 since the transistor 203 of the gate voltage control circuit 102 is ON and the transistor 301 is OFF. Thus, the gate voltage of transistor 907 becomes V1 and the transistor 907 keeps turning ON, while the transistor 905 and transistor 601 are OFF, therefore the voltage of output terminal VO keeps the level of V2.

On the other hand, since the transistor 201 of the gate voltage control circuit 100 is OFF and the transistor 300 is ON, the transistor 200 being in parallel connection has diode characteristics, but the voltage of output terminal 101 becomes V2. In this way, the gate voltage of transistor 906 becomes V2 and the transistor 906 keeps turning OFF, while the transistor 904 and transistor 600 are ON. Therefore, the voltage of output terminal VON keeps the level of V1. Thus, the operation will be completed.

When the voltage of input signal VIN shifts from "H" to "L", switching is similarly performed by the operation of the gate voltage control circuit 100 the same as described above.

In the exemplary embodiment 6, the transistor 600 (or transistor 601) of which gate is connected to the output terminal 101 (or output terminal 103) is connected between the transistor 906 (or transistor 907) and the transistor 904 (or transistor 905), and when both of the transistor 906 (or transistor 907) and transistor 904 (or transistor 905) are ON, the transistor 600 (or transistor 601) turns OFF. Consequently, through-current between the power source 901 and the power source 900 can be considerably reduced. Also, due to the gate voltage control circuit 100 (or gate voltage control circuit 102) which is controlled by the inverted signal 908 (or input signal VIN) of the input signal, high-speed switching operation can be obtained irrespective of the current ratio of the transistor 906 (or transistor 907) to the transistor 904 (or transistor 905). Also, even when the voltage of input signal is at a low level, high-speed switching operation can be obtained without increasing the area of the transistor 904 (or transistor 905).

According to the configuration of this exemplary embodiment, when the first transistor changes from ON to OFF, it takes a specific length of time for the first terminal voltage to change from the first power source voltage level to the second power source voltage level, and therefore, the fourth transistor keeps being ON for a specific length of time. On the other hand, the second transistor changes from OFF to ON, but the second switching circuit controlled by the gate voltage of the fourth transistor is OFF. Therefore, it is possible to reduce the through-current that flows to the first power source from the second power source. In the above operation, the power source voltage becomes lowered and the through-current can be greatly reduced in case both of the second and the fourth transistors keep being ON for a longer length of time. The effect can also be obtained by the first switching circuit even when the first transistor changes from OFF to ON.

(Exemplary Embodiment 7)

Figure 9:
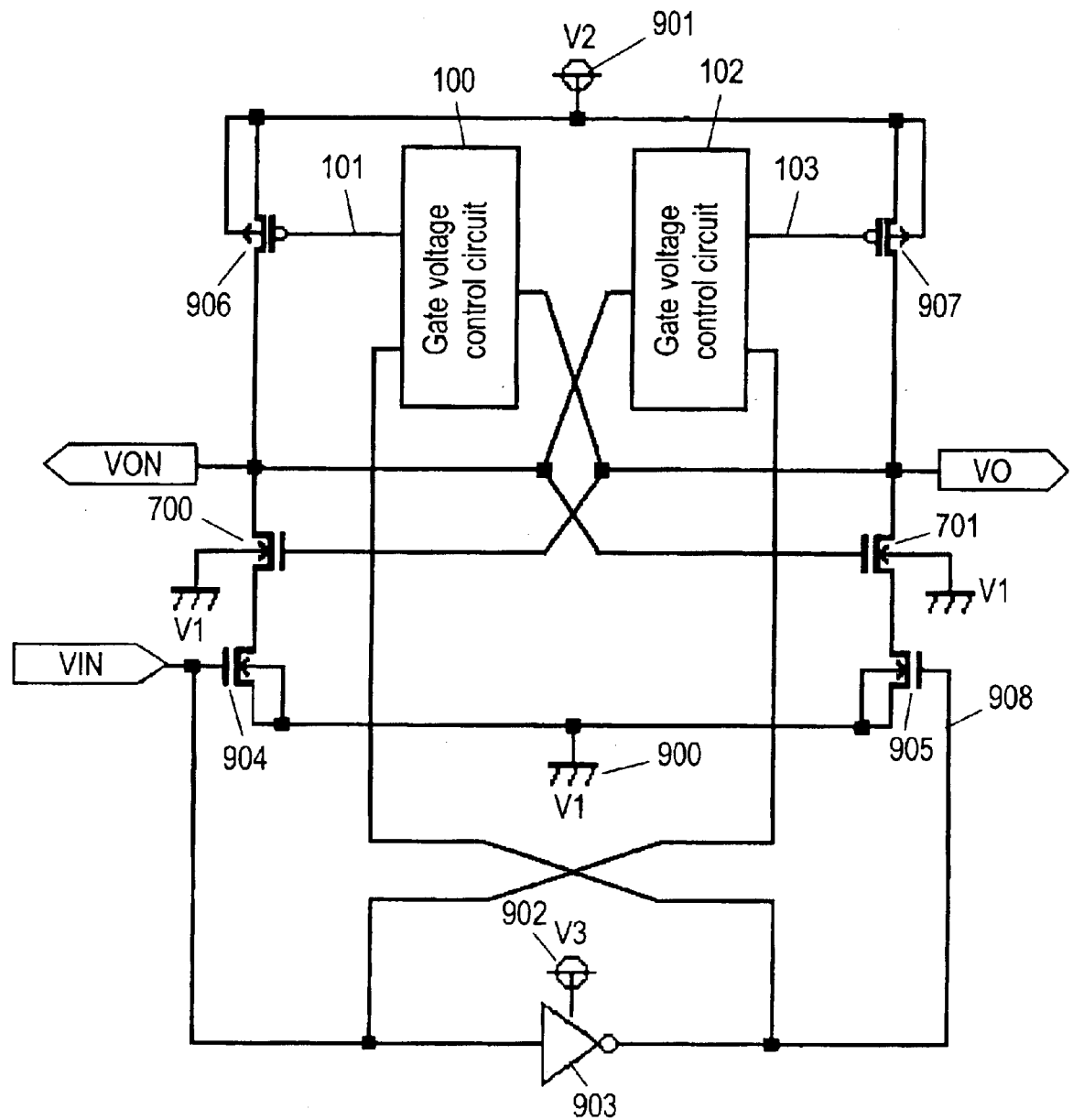
FIG. 9 is a schematic diagram of a level shift circuit in the exemplary embodiment 7 of the present invention.

FIG. 9 is a schematic diagram of a level shift circuit in the exemplary embodiment 7 of the present invention. In FIG. 9, the gate voltage control circuit 100 is connected to output terminal VO, and has output terminal 101. The gate voltage control circuit 102 is connected to output terminal VON, and has output terminal 103. In the first conduction type transistor 700 (hereafter referred to as transistor 700), the gate is connected to output terminal VO, and is connected between the output terminal VON and the transistor 904. In the first conduction type transistor 701 (hereafter referred to as transistor 701), the gate is connected to output terminal VON, and is connected between the output terminal VO and the transistor 905. The transistor 700 is a configuration example of the third switching circuit having a switching means. Also, the transistor 701 is a configuration example of the fourth switching circuit having a switching means.

The terminal VO is a terminal which outputs a level-shifted signal same in phase as the input signal VIN, and the terminal VON is a terminal which outputs a level-shifted signal inverse in phase to the input signal VIN. The voltage level of power source 900 is V1, the voltage level of power source 901 is V2, and the voltage level of power source 902 is V3. The voltage level V3 is the amplitude voltage of input signal VIN. This is a voltage level same as the level of V2 or a different voltage level. Inverter circuit 903 executes the logical inversion of input signal VIN. In the transistor 904, V1 is supplied to the source, input signal VIN is applied to the gate, and the source of transistor 700 is connected to the drain. In the transistor 905, V1 is supplied to the source, the logically inverted signal of input signal VIN is applied to the gate, and the source of transistor 701 is connected to the drain. In the transistor 906, V2 is supplied to the source, the output terminal 101 of the gate voltage control circuit 100 is connected to the gate, and the output terminal VON is connected to the drain. In the transistor 907, V2 is supplied to the source, the output terminal 103 of the gate voltage control circuit 102 is connected to the gate, and the output terminal VO is connected to the drain. The signal 908 is a signal reverse in phase to the input signal VIN.

An example of specific circuit and the operation of FIG. 9 will be described by using FIG. 10A and FIG. 10B.

Figure 10A:
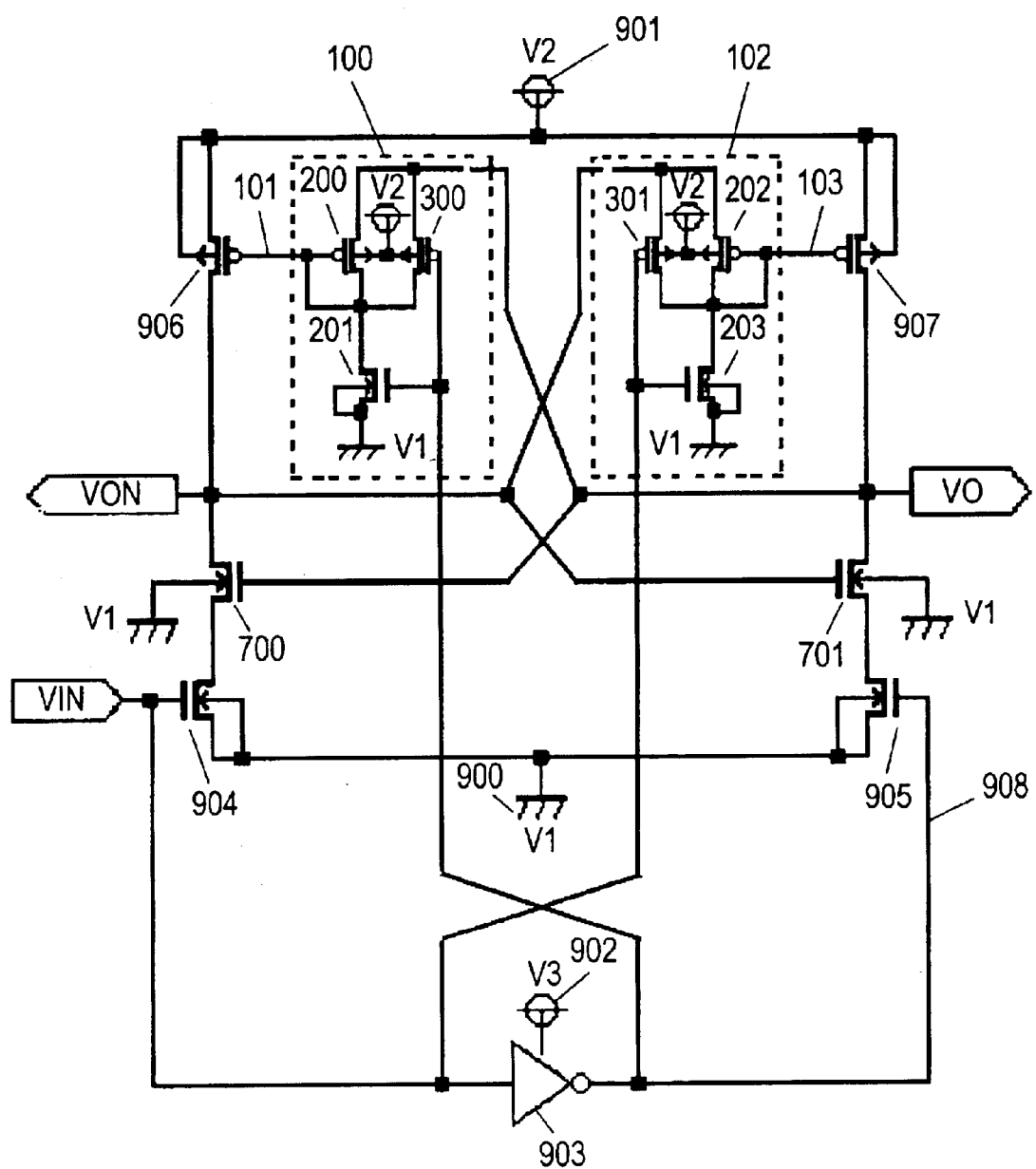
FIG. 10A is a diagram of a level shift circuit in the exemplary embodiment 7 of the present invention.

FIG. 10A is a diagram of a level shift circuit in the exemplary embodiment 7 of the present invention.

In FIG. 10A, the gate voltage control circuit 100 is connected to output terminal VO, and has output terminal 101. The gate voltage control circuit 102 is connected to output terminal VON, and has output terminal 103. In the transistor 200, the output terminal VO is connected to the source, and the gate and drain being in common connection are connected to the output terminal 101. In the transistor 201, the inverted signal of input signal VIN is applied to the gate, and the drain of transistor 200 is connected to the drain. In the transistor 202, the output terminal VON is connected to the source, while the gate and drain being in common connection are connected to the output terminal 103. In the transistor 203, the input signal VIN is connected to the gate, and the drain is connected to the drain of transistor 202. The transistor 300 is controlled by the inverted signal of input signal VIN, and is connected between the output terminal VO and the drain of transistor 200. The transistor 301 is controlled by the input signal VIN, and is connected between the output terminal VON and the drain of transistor 203.

Here, the drain current with transistor 300 being ON is 1/N (N is a value larger than 1) as against the drain current with transistor 201 being ON, and the drain current with transistor 301 being ON is set to 1/N (N is a value larger than 1) as against the drain current with transistor 203 being ON.

Incidentally, in FIG. 10A, same circuit elements, power sources and signals as in FIG. 9 are given same reference numerals.

Figure 10B:
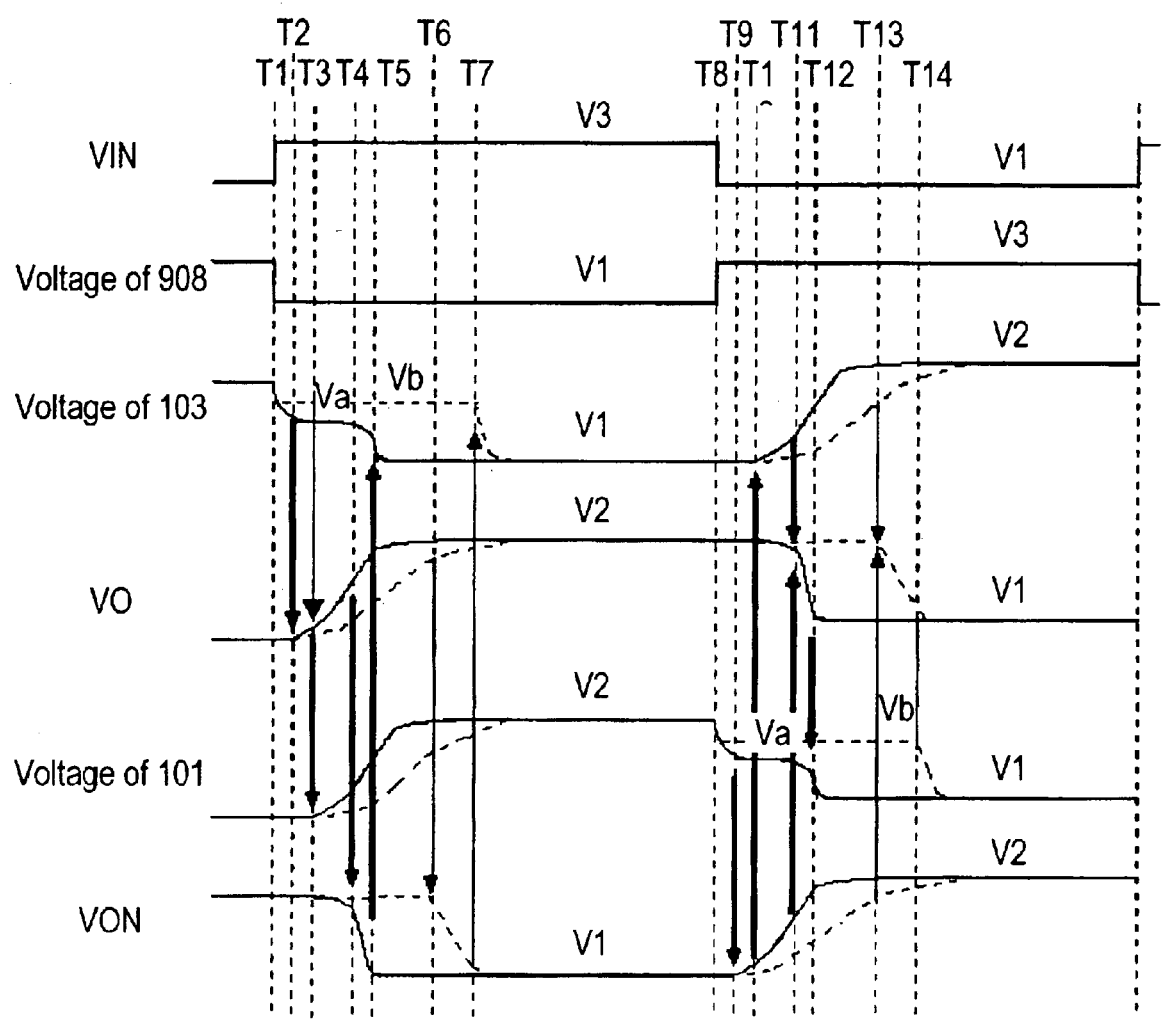
FIG. 10B is a timing chart of a level shift circuit in the exemplary embodiment 7 of the present invention.

FIG. 10B is a timing chart of a level shift circuit in the exemplary embodiment 7 of the present invention. The operation will be described by using FIG. 10A and FIG. 10B.

When the voltage of input signal VIN is "L", the voltage of signal 908 is "H". Accordingly, the transistor 904, transistor 203, and transistor 300 are OFF, while the transistor 905, transistor 201, and transistor 301 are ON. Also, the voltage of output terminal VO is V1, then the transistor 906 turns ON and the transistor 700 turns OFF. Therefore, the voltage of output terminal VON is V2. The voltage V2 of output terminal VON is given to the gate of transistor 907 from the output terminal 103 of the gate voltage control circuit 102 via the transistor 301. Accordingly, the gate voltage of transistor 907 is V2, and the transistor 907 is OFF, and the transistor 701 is ON.

In the above condition, when the voltage of input signal VIN shifts from "L" to "H" at time T1, the voltage of signal 908 simultaneously shifts from "H" to "L". Thus, the transistor 904 and transistor 203 change from OFF to ON, while the transistor 905 and transistor 201 change from ON to OFF.

Then, the transistor 300 and transistor 301 change in gate voltage due to the input signal VIN, but both of them turn OFF. At the time, the transistor 906 and transistor 904 turn ON, and the transistor 907 and transistor 905 turn OFF. Both of the transistor 906 and transistor 904 turn ON, but since the voltage of output terminal VO keeps the level of V1, the transistor 700 is OFF, and therefore, no through-current flows to the power source 900 from the power source 901 via the transistor 906 and the transistor 904.

The operation in the case of voltage V3 being equal to or higher than V2 when the input signal VIN is "H" will be described in the following. Since the drain current of transistor 203 is at a high level, the output terminal 103 of the gate voltage control circuit 102 makes the gate voltage of transistor 907 lower from the level of V2 to the level of Va. The transistor 907 turns ON at time T2, and the voltage of output terminal VO rises from the level of V1. At the same time, the ON resistance of transistor 700 is decreased. Because the ON resistance of transistor 907 is low, the voltage of output terminal 101 of the gate voltage control circuit 100 rises via the transistor 200 that has diode characteristics, and the gate voltage of transistor 906 rises at time T3.

At time T4, when the voltage of output terminal VO rises and the ON resistance of transistor 700 becomes sufficiently lowered, the voltage of output terminal VON begins to lower from the level of V2 because the drain current of transistor 904 is greater enough than the drain current of transistor 906. The voltage of output terminal VON is supplied to the gate of transistor 907 from the output terminal 103 of the gate voltage control circuit 102 via the transistor 202 that has diode characteristics and the transistor 301 that is low in the level of drain current. Accordingly, the gate voltage of transistor 907 lowers to the level of V1 at time T5 that is later than T4.

Next, the operation in the case of voltage V3 being lower than V2 when the input signal VIN is "H" will be described. Since the drain current of transistor 203 is at a low level, the output terminal 103 of the gate voltage control circuit 102 makes the gate voltage of transistor 907 lower only from the level of V2 to the level of Vb. The transistor 907 turns ON at time T3, and the voltage of output terminal VO rises from the level of V1. At the same time, the ON resistance of transistor 700 decreases. Because the ON resistance of transistor 907 becomes higher, the voltage of output terminal VO is slow to increase, and the output terminal 101 of the gate voltage control circuit 100 makes the gate voltage of transistor 906 rise at time T4.

At time T6, when the ON resistance of transistor 906 becomes higher and the voltage of output terminal VO rises and the ON resistance of transistor 700 becomes lowered, the voltage of output terminal VON begins to lower from the level of V2 via the transistor 904. The voltage of output terminal VON is supplied to the gate of transistor 907 from the output terminal 103 of the gate voltage control circuit 102 via the transistor 202 that has diode characteristics and the transistor 301 whose drain current is at a low level. Accordingly, the gate voltage of transistor 907 lowers to the level of V1 and the voltage of output terminal VO becomes V2 at time T7 that is later than T6.

Through the above operation, while the voltage of input signal VIN is "H", the gate voltage of transistor 907 becomes V1 and the transistor 907 keeps ON, and the transistor 905 and transistor 701 are OFF. Therefore, the voltage of output terminal VO keeps the level of V2. On the other hand, the gate voltage of transistor 906 becomes V2, and the transistor 906 keeps OFF, and the transistor 904 and transistor 700 are ON. Therefore, the voltage of output terminal VON keeps the level of V1. Thus, the operation will be completed.

Also, when the voltage of input signal VIN shifts from "H" to "L", switching is similarly performed by the operation of the gate voltage control circuit 100 the same as described above.

In this exemplary embodiment 7, the transistor 700 (or transistor 701) of which gate is connected to the output terminal VO (or output terminal VON) is connected between the transistor 906 (or transistor 907) and the transistor 904 (or transistor 905), and when both of the transistor 906 (or transistor 907) and the transistor 904 (or transistor 905) are ON, the transistor 700 (or transistor 701) turns OFF. Accordingly, the through-current between power source 901 and power source 900 can be greatly reduced. Also, due to the gate voltage control circuit 100 (or gate voltage control circuit 102) controlled by the inverted signal 908 (input signal VIN) of the input signal, high-speed switching operation can be obtained irrespective of the current ratio of the transistor 906 (or transistor 907) to the transistor 904 (or transistor 905). Also, even in case the voltage level of the input signal is low, high-speed switching operation can be obtained without increasing the area of the transistor 904 (or transistor 905).

According to the configuration of this exemplary embodiment, when the first transistor changes from ON to OFF, it takes a specific length of time for the first terminal voltage to change from the first power source voltage level to the second power source voltage level, and therefore, the fourth transistor is ON for a specific length of time. On the other hand, the second transistor changes from OFF to ON, but the fourth switching circuit is OFF because the first terminal voltage is low. Therefore, it is possible to reduce the through-current that flows to the first power source from the second power source. The effect can also be obtained by the third switching circuit when the first transistor changes from OFF to ON.

As the first terminal voltage rises, the gate voltage of the fourth transistor is supplied from the first terminal via a diode circuit provided in the second gate voltage control circuit. Therefore, when the "H" level of the first (or the second) input signal is high and the level of the first terminal voltage rapidly increases, the gate voltage of the fourth transistor rises later than the first terminal voltage. Also, when the "H" level of the first (or the second) input signal is low and the level of the first terminal voltage slowly increases, the gate voltage of the fourth transistor rises at nearly same speed as that of the first terminal voltage. Accordingly, due to the fourth transistor controlled by the first terminal voltage, when the "H" level of the first (or the second) input signal is high, the fourth switching circuit can be readily turned ON even in case the gate-source voltage of the fourth transistor is high. In this way, the second terminal voltage is lowered, thereby realizing high-speed operation.

Also, when the "H" level of the first (or the second) input signal is low, the difference between the first terminal voltage and the gate voltage of the fourth transistor is very little. Therefore, the fourth switching circuit is slowly turned ON, and the through-current to the first power source from the second power source can be reduced. Also when the second transistor changes from ON to OFF, similar operations are performed in the first gate voltage control circuit and the first switching circuit, and it is possible to reduce the through-current. Also, the power consumed by the level shift circuit can be reduced.

(Exemplary Embodiment 8)

Figure 11:
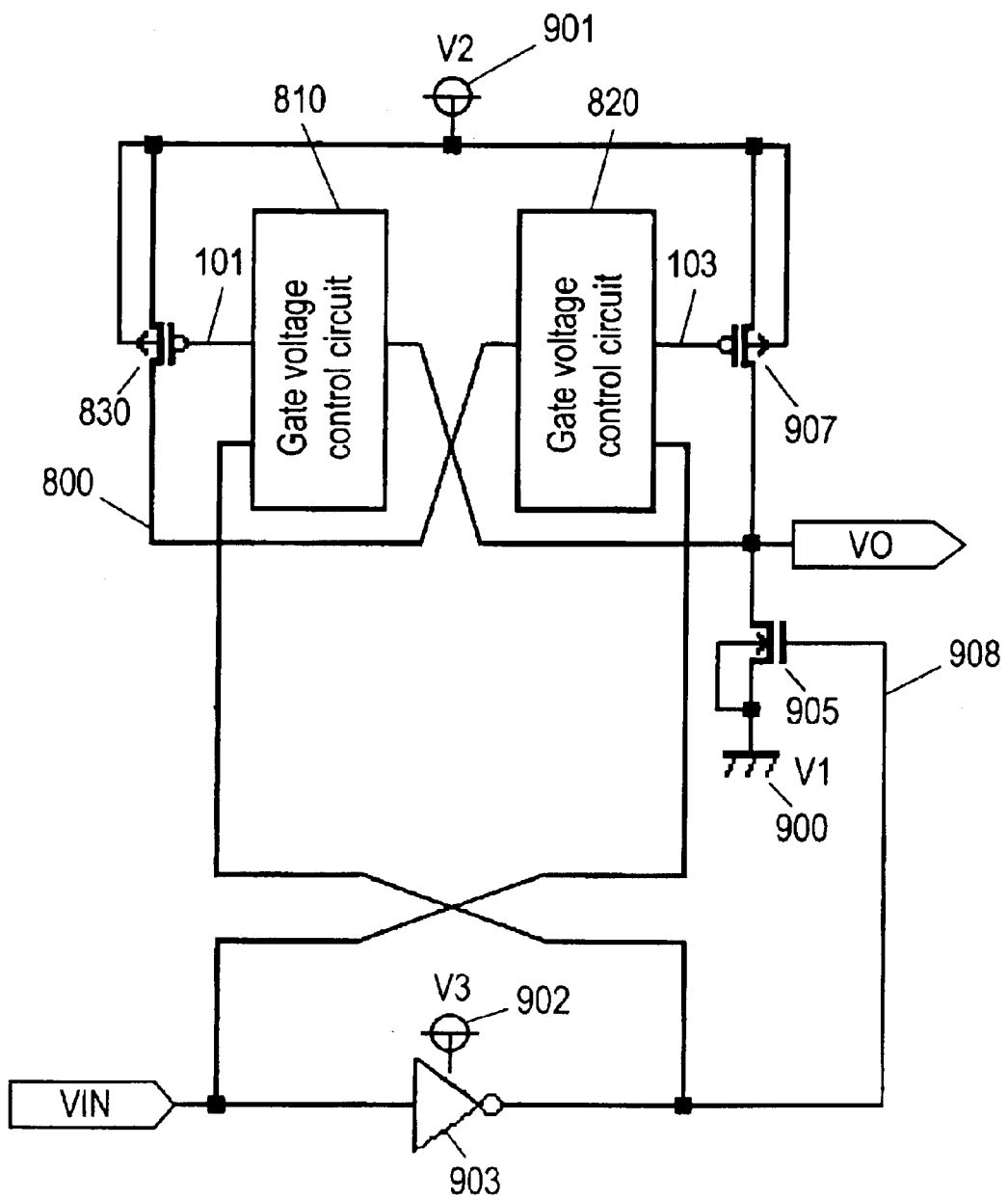
FIG. 11 is a schematic diagram of a level shift circuit in the exemplary embodiment 8 of the present invention.

FIG. 11 shows a diagram of a level shift circuit in the exemplary embodiment 8 of the present invention.

In FIG. 11, gate voltage control circuit 810 as the third gate voltage control circuit is connected to output terminal VO, and has output terminal 101. The gate control circuit 820 as the fourth gate voltage control circuit has output terminal 103. VIN is input signal, and VO is a terminal that outputs a level-shifted signal same in phase as the input signal VIN, and VON is a terminal that outputs a level-shifted signal reverse in phase to the input signal VIN. In the second conduction type transistor 830 (hereafter referred to as transistor 830) as the thirteenth transistor, voltage level V2 is supplied to the source, the output terminal of 101 of gate voltage control circuit 810 is connected to the gate, and the drain 800 is connected to the gate voltage control circuit 820. The voltage level of power source 900 is V1, the voltage level of power source 901 is V2, and the voltage level of power source 902 is V3. The voltage level V3 is the amplitude voltage of input signal VIN. This is a voltage level same as the level of V2 or a different voltage level. Inverter circuit 903 executes the logical inversion of input signal VIN. In the transistor 905, V1 is supplied to the source, the logically inverted signal of input signal VIN is applied to the gate. In the transistor 907, V2 is supplied to the source, the output terminal 103 of the gate voltage control circuit 820 is connected to the gate, and the output terminal VO is connected to the drain. The signal 908 is a signal reverse in phase to the input signal VIN.

Figure 12A:
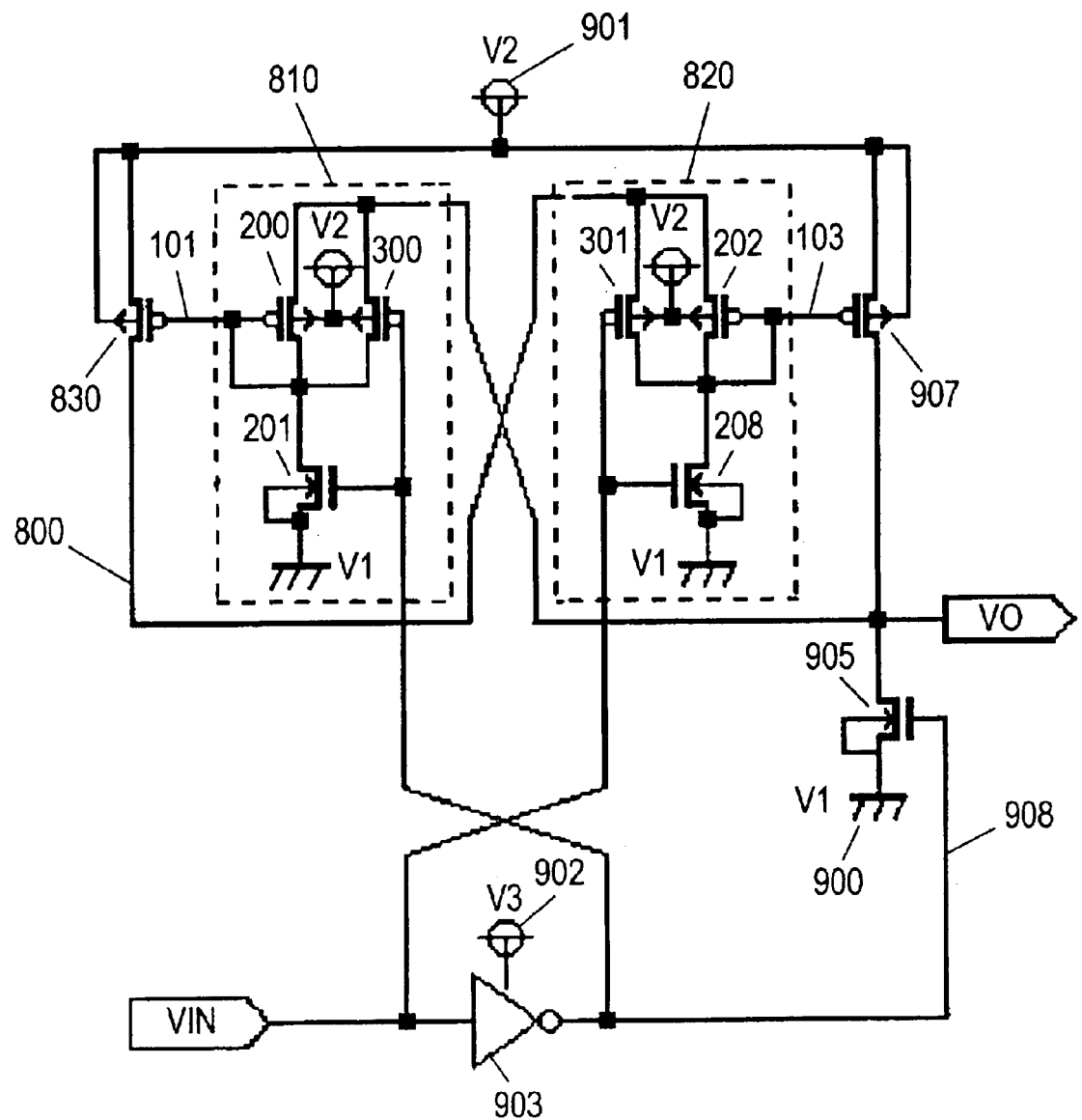
FIG. 12A is a diagram of a level shift circuit in the exemplary embodiment 8 of the present invention.

An example of specific circuit and the operation of FIG. 11 will be described by using FIG. 12A and FIG. 12B. FIG. 12A is a diagram of a level shift circuit in the exemplary embodiment 8 of the present invention.

In FIG. 12A, the gate voltage control circuit 810 is connected to output terminal VO, and has output terminal 101. The gate voltage control circuit 820 is connected to terminal 800, and has output terminal 103. In the transistor 200, the output terminal VO is connected to the source, and the gate and drain being in common connection are connected to the output terminal 101. In the transistor 201, the inverted signal 908 of input signal VIN is applied to the gate, and the drain is connected to the drain of transistor 200. In the transistor 202, the terminal 800 is connected to the source, while the gate and drain being in common connection are connected to the output terminal 103. In the transistor 203, the input signal VIN is applied to the gate, and the drain is connected to the drain of transistor 202. The transistor 300 is controlled by the inverted signal of input signal VIN, and is connected between the output terminal VO and the drain of transistor 200. The transistor 301 is controlled by the input signal VIN, and is connected between the terminal 800 and the drain of transistor 202.

Here, the drain current with transistor 300 being ON is 1/N (N is a value larger than 1) as against the drain current with transistor 201 being ON, and the drain current with transistor 301 being ON is set to 1/N (N is a value larger than 1) as against the drain current with transistor 203 being ON.

Incidentally, same circuit elements, power sources and signals as in FIG. 11 are given same reference numerals.

Figure 12B:
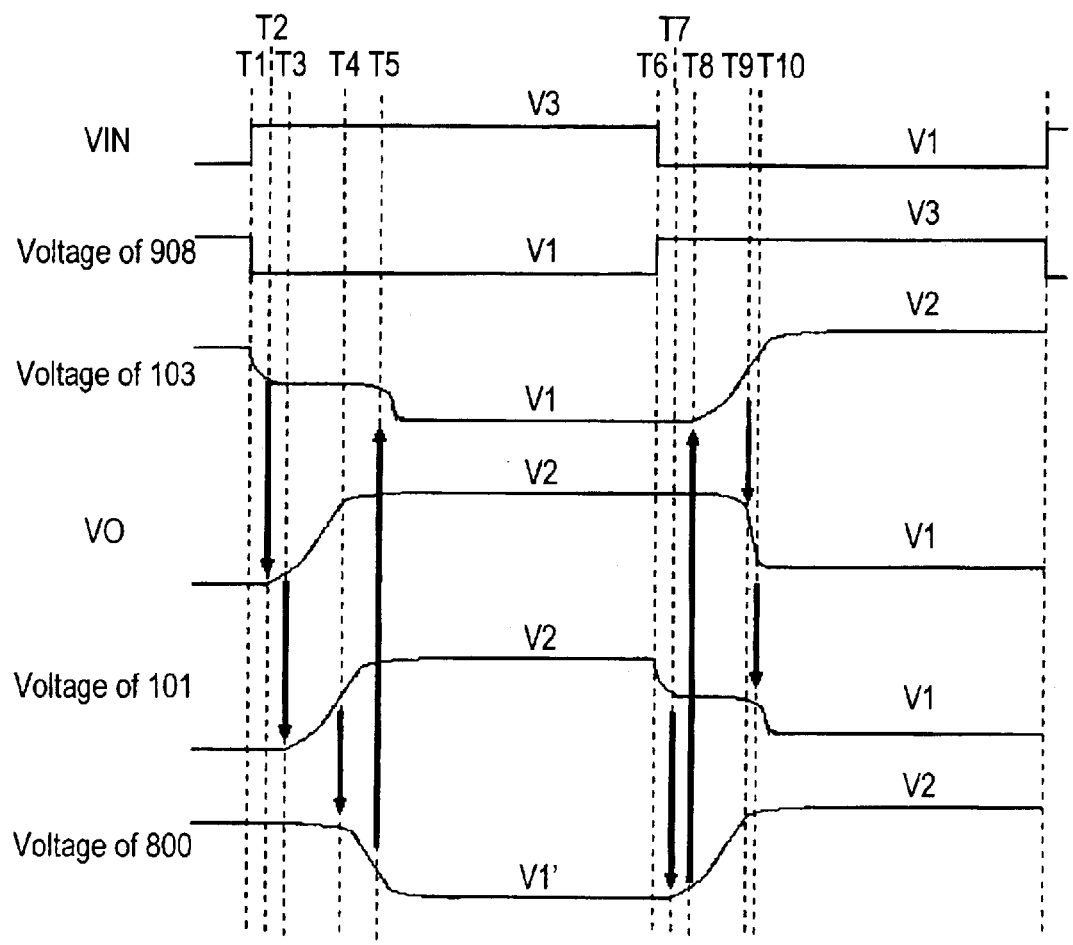
FIG. 12B is a timing chart of a level shift circuit in the exemplary embodiment 8 of the present invention.

FIG. 12B is a timing chart of a level shift circuit in the exemplary embodiment 8 of the present invention. The operation will be described by using FIG. 12A and FIG. 12B.

When the voltage of input signal VIN is "L", the voltage of signal 908 is "H". Accordingly, the transistor 203 and transistor 300 are OFF, while the transistor 905, transistor 201, and transistor 301 are ON. Also, the voltage of output terminal VO is V1, then the transistor 830 turns ON. As a result, the voltage of terminal 800 is V2. Since the voltage V2 of terminal 800 is given to the gate of transistor 907 from the output terminal 103 of the gate voltage control circuit 820 via the transistor 301, the gate voltage of transistor 907 is V2, and the transistor 907 is OFF.

In the above condition, when the voltage of input signal VIN shifts from "L" to "H" at time T1, the voltage of signal 908 simultaneously shifts from "H" to "L". Thus, the transistor 203 changes from OFF to ON, while the transistor 201 changes from ON to OFF. Then, the transistor 300 and transistor 301 change in gate voltage due to the input signal VIN, and both of them turn OFF. Accordingly, the voltage of output terminal 103 applied to the gate of transistor 907 lowers from the level of V2 and reaches a certain voltage level according to the drain current of transistor 203. When the transistor 907 turns ON at time T2, the voltage of output terminal VO rises from the level of V1. The voltage of output terminal VO is supplied to the gate of transistor 830 from the output terminal 101 of the gate voltage control circuit 100 via the transistor 200 having diode characteristics and the transistor 300 whose drain current level is low, and therefore, the gate voltage of transistor 830 rises at time T3 that is later than T2. At time T4, when the drain current of transistor 830 is suppressed, the voltage of terminal 800 begins to lower from the level of V2. The voltage of terminal 800 is supplied to the gate of transistor 907 from the output terminal 103 of the gate voltage control circuit 820 via the transistor 202 having diode characteristics and the transistor 301 whose drain current level is low, and therefore, the gate voltage of transistor 907 lowers to the level of V1 at time T5 that is later than T4.

Through the above operation, while the voltage of input signal VIN is "H", the gate voltage of transistor 907 becomes V1 and the transistor 907 keeps ON, and the transistor 905 is OFF. Therefore, the voltage of output terminal VO keeps the level of V2. On the other hand, the gate voltage of transistor 830 becomes V2, and the transistor 906 keeps OFF. Thus, the operation will be completed.

Also, when the voltage of input signal VIN shifts from "H" to "L", switching is similarly performed by the operation of the gate voltage control circuit 810 the same as described above.

In this exemplary embodiment 8, since there is provided output terminal VO only, the transistor 904 shown in the exemplary embodiment 7 can be eliminated, and the layout area and the power consumed can be reduced. Also, even in case the voltage level of the input signal is low, it is possible to realize high-speed switching operation without increasing the area of the transistor 905.

(Exemplary Embodiment 9)

Figure 13A:
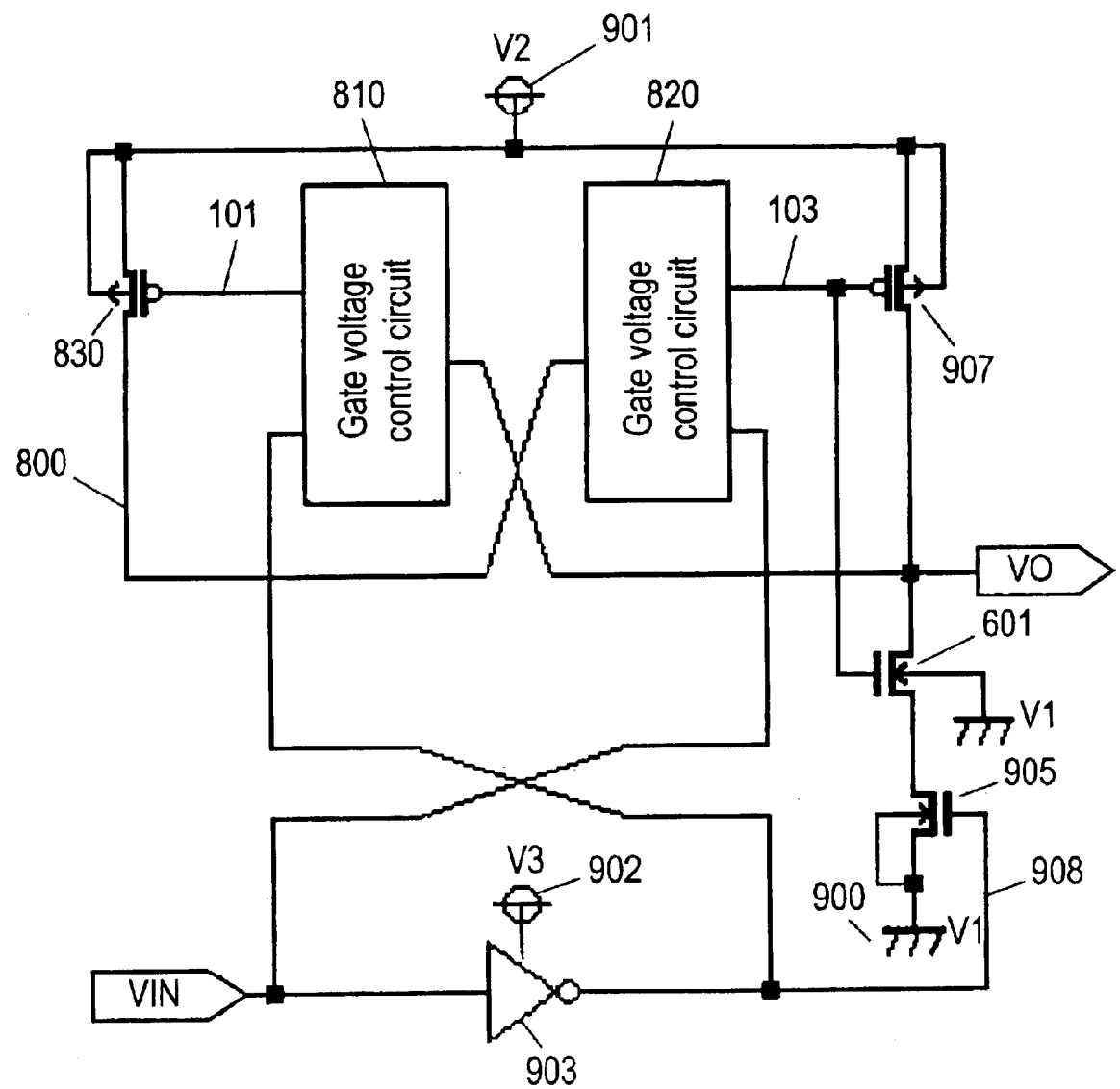
FIG. 13A is a schematic diagram of a level shift circuit in the exemplary embodiment 9 of the present invention.

FIG. 13A is a diagram of a level shift circuit in the exemplary embodiment 9 of the present invention.

FIG. 13A is a configuration with the first conduction type transistor 601 added to the exemplary embodiment 8 of FIG. 11. The transistor 601 is inserted between the output terminal VO and the drain of transistor 905, and the gate is connected to the output terminal 103 of the gate voltage control circuit 820. The transistor 601 is a configuration example of the second switching circuit having a switching means.

In the above configuration, when the voltage of input signal VIN shifts from "H" to "L" with the transistor 907 turned ON, the transistor 905 changes from OFF to ON, but the transistor 601 is in a state of OFF. On the other hand, the voltage of the output terminal 101 of the gate voltage control circuit 810 becomes lowered, and the transistor 830 turns ON. Accordingly, the voltage of terminal 800 rises, then the transistor 907 is turned OFF, and the output terminal VO changes from V2 to V1 via the transistor 905. In this case, even when the voltage of input signal VIN shifts from "L" to "H", the operation is similarly performed by the gate voltage control circuit 820.

In the exemplary embodiment 9, the transistor 601 with the gate connected to the output terminal 103, which is positioned between the transistor 907 and the transistor 905, is added to the exemplary embodiment 8. When both of the transistor 907 and the transistor 905 are ON, the transistor 601 turns OFF, and through-current between power source 901 and power source 900 can be greatly reduced. Also, due to the gate voltage control circuit 810 (820) controlled by the inverted signal 908 (input signal VIN) of the input signal, high-speed switching operation can be obtained irrespective of the current ratio of the transistor 830 (907) to the transistor 905. Also, the layout area can be reduced the same as in the exemplary embodiment 8. Further, even in case the voltage level of input signal is low, it is possible to achieve high-speed switching operation without increasing the area of the transistor 905.

(Exemplary Embodiment 10)

Figure 13B:
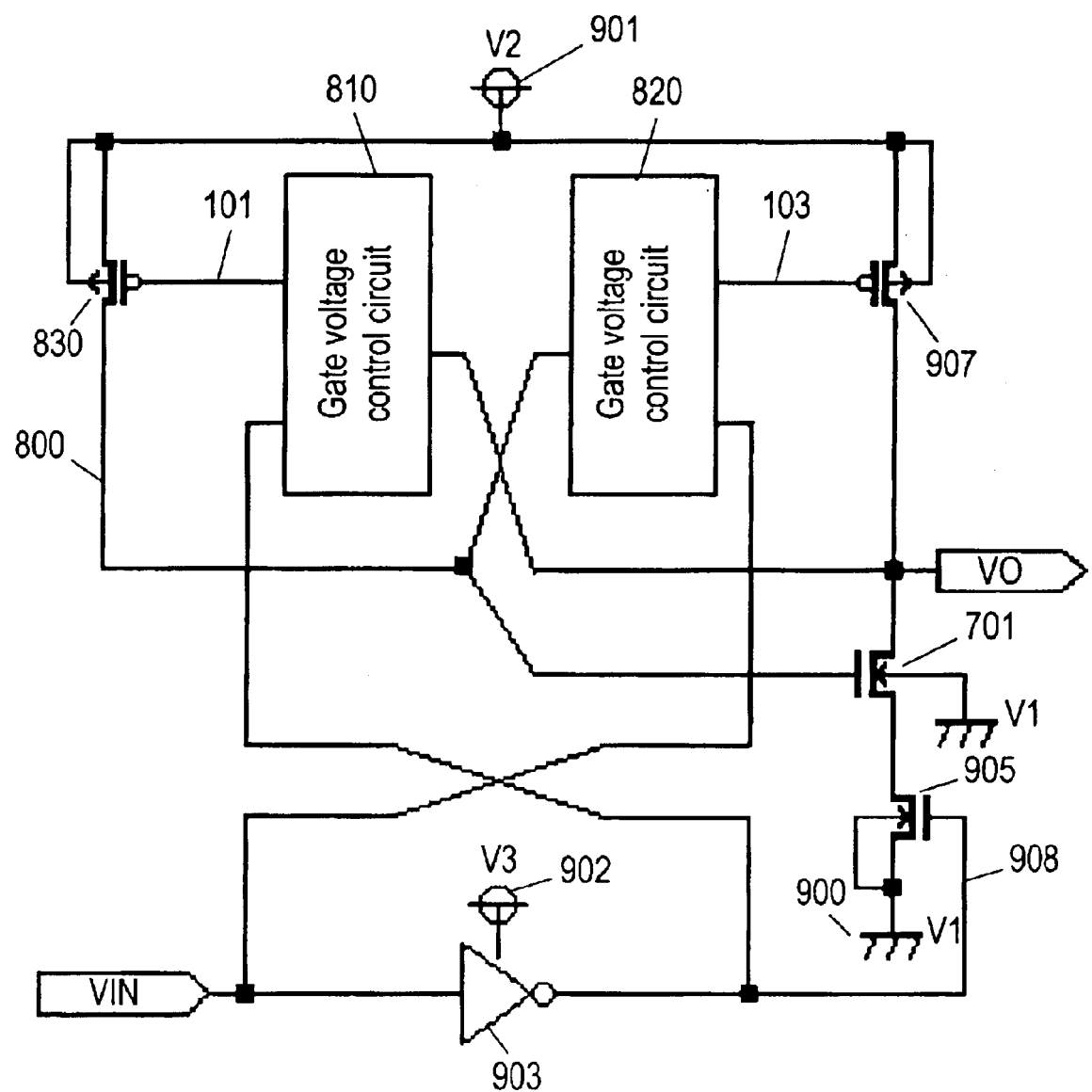
FIG. 13B is a schematic diagram of a level shift circuit in the exemplary embodiment 10 of the present invention.
Figure 14A:
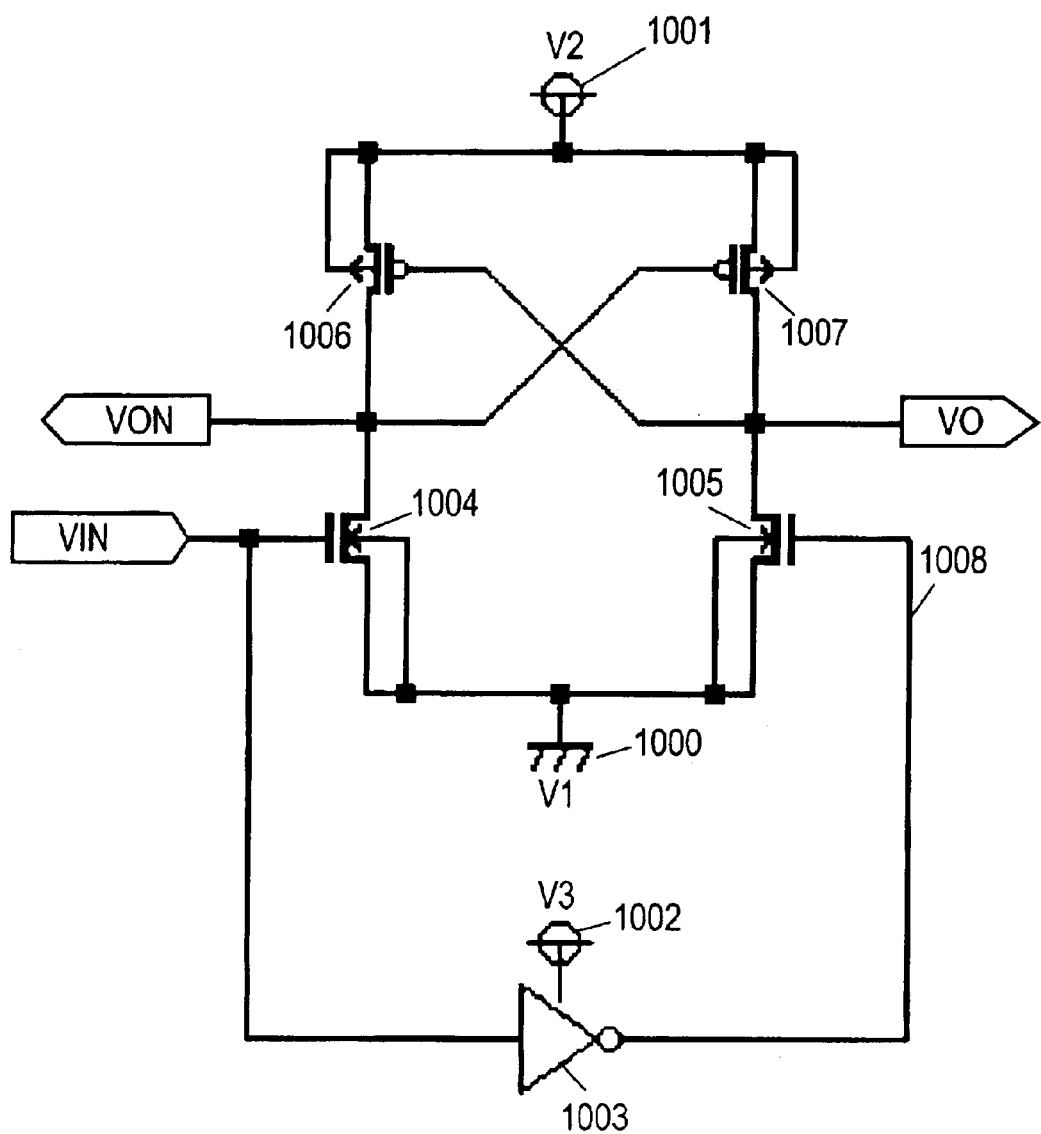
FIG. 14A is a diagram of a conventional level shift circuit.
Figure 14B:
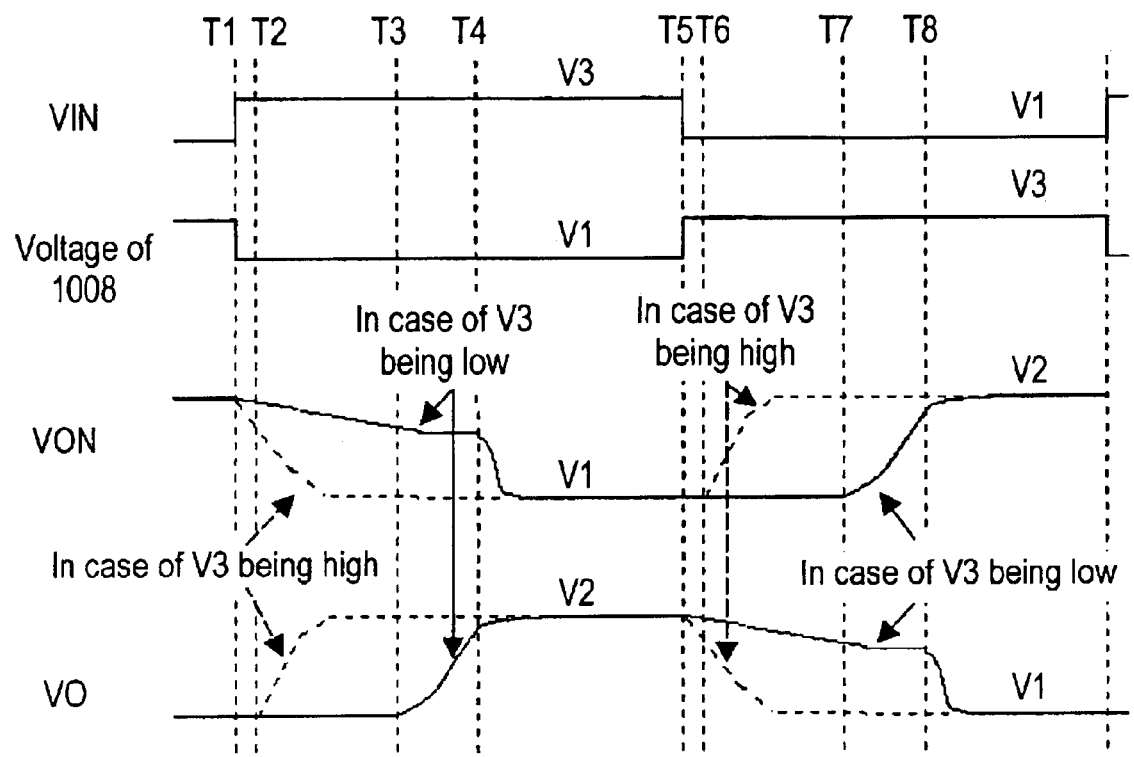
FIG. 14B is a timing chart of a conventional level shift circuit.

FIG. 13B is a diagram of a level shift circuit in the exemplary embodiment 10 of the present invention. FIG. 13B is a configuration with the first conduction type transistor 701 added to the exemplary embodiment 8 of FIG. 11. The transistor 701 is inserted between the output terminal VO and the transistor 905, and the gate is connected to the drain 800. The transistor 701 is a configuration example of the fourth switching circuit having a switching means.

In FIG. 13B, when the voltage of input signal VIN shifts from "H" to "L" with the transistor 907 being ON, the transistor 905 changes from OFF to ON, but the transistor 701 is in a state of OFF. On the other hand, the voltage of the output terminal 101 of the gate voltage control circuit 810 becomes lowered, and the transistor 830 turns ON. Accordingly, the voltage of terminal 800 rises, then the transistor 907 turnes OFF, and the voltage of output terminal VO changes from V2 to V1 via the transistor 905. Even when the voltage of input signal VIN shifts from "L" to "H", the operation is similarly performed by the gate voltage control circuit 820.

In the exemplary embodiment 10, the transistor 701 is added to the exemplary embodiment 8. The transistor 701 is inserted between the transistor 907 and the transistor 905, and the terminal 800 is connected to the gate. When both of the transistor 907 and the transistor 905 are ON, the transistor 701 turns OFF, and through-current between power source 901 and power source 900 can be greatly reduced. Also, due to the gate voltage control circuit 810 (820) controlled by the inverted signal 908 (input signal VIN) of the input signal, high-speed switching operation can be obtained irrespective of the current ratio of the transistor 830 (907) to the transistor 905. Also, the layout area can be reduced the same as in the exemplary embodiment 8. Further, even in case the voltage level of input signal is low, it is possible to achieve high-speed switching operation without increasing the area of the transistor 905.

According to these exemplary embodiments 8, 9, and 10, since there is provided only one output terminal, the first transistor for applying the input signal can be disused without changing the operational speed and power consumption. In addition, even in case of adding the second switching circuit or the fourth switching circuit, the first switching circuit or the third switching circuit can be disused, and it is possible to reduce the layout area.

In each of the above exemplary embodiments, when the first conduction type transistor is a P-channel MOS transistor, the second conduction type transistor is an N-channel MOS transistor, and when the first conduction type transistor is an N-channel MOS transistor, the second conduction type transistor is a P-channel MOS transistor, and similar effects can be obtained in any of the cases.

As described above, in the present invention, the second gate voltage control circuit controlled by the input signal is arranged between the first output terminal and the gate of fourth transistor, while the first gate voltage control circuit controlled by the inverted signal of input signal is arranged between the second output terminal and the gate of third transistor. In this way, even in case the amplitude voltage V3 of input signal is lower than the power source voltage V2, when the voltage of the input signal shifts from "L" to "H", the change in voltage of the first output terminal is not related with the current ratio of the first transistor to the third transistor, and the gate voltage of the third transistor is controlled by the first and second gate voltage control circuits. As a result, the voltage of the first output terminal changes at a high speed, and the through-current is reduced. Also, same holds true with respect to the second output terminal. Further, the voltage change is not related with the current ratio of the first transistor to the third transistor and of the second transistor to the fourth transistor, it is not necessary to take into account the size ratio of transistors. Accordingly, it is possible to provide a level shift circuit wherein the layout areas of the first and second transistors are reduced.

What is claimed is:

1. A level shift circuit, comprising:
   a first conduction type first transistor wherein a first power source voltage is supplied to a source, a first input signal is applied to a gate, and a first terminal is connected to a drain;
   a first conduction type second transistor wherein a second input signal in reverse relation to the first input signal is applied to a gate, and a drain is connected to a second terminal;
   a second conduction type third transistor wherein a second power source voltage is supplied to a source, and the first terminal is connected to a drain;
   a second conduction type fourth transistor wherein the second terminal is connected to a drain;
   a first gate voltage control circuit connected to the second terminal, input the second input signal, and making said third transistor turn ON when said first transistor is OFF, a maximum driving voltage for the first gate voltage control circuit being lower than the second power source voltage by a voltage drop of the fourth transistor; and
   a second gate voltage control circuit connected to the first terminal, input the first input signal, and making said fourth transistor turn ON when said second transistor is OFF, a maximum driving voltage for the second gate voltage control circuit being lower than the second power source by a voltage drop of the third transistor.

2. The level shift circuit of claim 1, wherein said first gate voltage control circuit comprises:
   a first conduction type fifth transistor in which the first power source voltage is supplied to a source, a gate of said third transistor is connected to a drain, and the second input signal is applied to a gate; and
   a second conduction type sixth transistor in which the second terminal is connected to a source, and the gate of said third transistor is connected to a gate and a drain, wherein said second gate voltage control circuit comprises:
   a first conduction type seventh transistor in which the first power source voltage is supplied to a source, a gate of said fourth transistor is connected to a drain, and the first input signal is applied to a gate; and
   a second conduction type eighth transistor in which the first terminal is connected to a source, and the gate of said fourth transistor is connected to a gate and a drain.

3. The level shift circuit of the claim 2,
wherein said first gate voltage control circuit further comprises a second conduction type ninth transistor in which the second terminal is connected to a source, the gate of said third transistor is connected to a drain, and the second input signal is applied to a gate, and
wherein said second gate voltage control circuit further comprises a second conduction type tenth transistor in which the first terminal is connected to a source, the gate of said fourth transistor is connected to a drain, and the first input signal is applied to a gate.

4. The level shift circuit of the claim 1,
wherein said first gate voltage control circuit comprises:
   a first conduction type fifth transistor in which the first power source voltage is supplied to a source, the gate of the third transistor is connected to a drain, and the second input signal is applied to a gate; and
   a second conduction type eleventh transistor in which the second terminal is connected to a source, the gate of the third transistor is connected to a gate and a drain, and a current flows between the source and the drain even when a gate-source voltage is 0V,
wherein said second gate voltage control circuit comprises:
   a first conduction type seventh transistor in which the first power source voltage is supplied to a source, the gate of the fourth transistor is connected to a drain, and the first input signal is applied to a gate; and
   a second conduction type twelfth transistor in which the first terminal is connected to a source, and the gate of the fourth transistor is connected to a gate and a drain, and a current flows between the source and the drain even when a gate-source voltage is 0V.

5. The level shift circuit of claim 1, further comprising:
   a first switching circuit connected in series relation to said first transistor between the first terminal and the first power source, controlled by a gate voltage of said third transistor, and having a switching means which turns ON when said third transistor is OFF; and
   a second switching circuit connected in series relation to said second transistor between the second terminal and the first power source, controlled by a gate voltage of said fourth transistor, and having a switching means which turns ON when said fourth transistor is OFF.

6. The level shift circuit of claim 1, further comprising:
   a third switching circuit connected in series relation to said first transistor between the first terminal and the first power source, controlled by a voltage of the second terminal, and having a switching means which turns OFF when a voltage of the second terminal is at same voltage level as the first power source voltage; and
   a fourth switching circuit connected in series relation to said second transistor between the second terminal and the first power source, controlled by a voltage of the first terminal, and having a switching means which turns OFF when a voltage of the first terminal is at same voltage level as the first power source voltage.

7. A level shift circuit, comprising:
a first conduction type second transistor wherein a first power source voltage is supplied to a source, a second input signal in reverse relation to a first input signal is applied to a gate, and a drain is connected to a second terminal;
a second conduction type fourth transistor wherein a second power source voltage is supplied to a source, and the second terminal is connected to a drain;
a second conduction type thirteenth transistor wherein the second power source voltage is supplied to a source;
a third gate voltage control circuit connected to the second terminal, input the second input signal, and making said thirteenth transistor turn ON when the second input signal is at a high level, a maximum driving voltage for the third gate voltage control circuit being lower than the second power source voltage by a voltage drop of the fourth transistor; and
a fourth gate voltage control circuit connected to a drain of said thirteenth transistor, input the first input signal, and making said fourth transistor turn ON when the first input signal is at a high level, a maximum driving voltage for the fourth gate voltage control circuit being lower than the second power source by a voltage drop of the thirteenth transistor.

8. The level shift circuit of claim 7, further comprising:
a second switching circuit connected in series relation to said second transistor between the second terminal and the first power source, and also connected to a gate of said fourth transistor.

9. The level shift circuit of claim 7, further comprising:
a fourth switching circuit connected in series relation to said second transistor between the second terminal and the first power source, and also connected to a drain of said thirteenth transistor.

* * * * *